United States Patent
Hong et al.

(10) Patent No.: US 12,249,673 B2
(45) Date of Patent: Mar. 11, 2025

(54) LIGHT-EMITTING DEVICE AND DISPLAY APPARATUS INCLUDING THE SAME

(71) Applicant: SAMSUNG ELECTRONICS CO., LTD., Suwon-si (KR)

(72) Inventors: Seogwoo Hong, Yongin-si (KR); Hyunjoon Kim, Seoul (KR); Joonyong Park, Suwon-si (KR); Kyungwook Hwang, Seoul (KR); Junsik Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 532 days.

(21) Appl. No.: 17/519,754

(22) Filed: Nov. 5, 2021

(65) Prior Publication Data

US 2022/0246801 A1    Aug. 4, 2022

Related U.S. Application Data

(60) Provisional application No. 63/145,117, filed on Feb. 3, 2021.

(30) Foreign Application Priority Data

May 6, 2021    (KR) .................. 10-2021-0058769

(51) Int. Cl.
  *H01L 25/075*    (2006.01)
  *H01L 25/16*    (2023.01)
  (Continued)

(52) U.S. Cl.
  CPC .......... *H01L 33/382* (2013.01); *H01L 27/156* (2013.01)

(58) Field of Classification Search
  CPC .............. H01L 25/0753; H01L 25/167; H01L 27/1214; H01L 27/156; H01L 33/06;
  (Continued)

(56) References Cited

U.S. PATENT DOCUMENTS 8,120,047 B2    2/2012    Kim et al.
9,006,902 B2    4/2015    Choi et al.
(Continued)

FOREIGN PATENT DOCUMENTS

CN    102203968 A    9/2011
CN    106575688 A    4/2017
(Continued)

OTHER PUBLICATIONS

Communication issued May 6, 2022 by the European Patent Office in counterpart European Patent Application No. 21209023.7.
(Continued)

*Primary Examiner* — Omar F Mojaddedi
(74) *Attorney, Agent, or Firm* — Sughrue Mion, PLLC

(57) ABSTRACT

Provided is a light-emitting device including a body including a first semiconductor layer, an active layer, and a second semiconductor layer, a first electrode and a second electrode provided on a first surface of the body, the first electrode and the second electrode being in contact with the first semiconductor layer and the second semiconductor layer, respectively, and a third electrode and a fourth electrode provided on a second surface of the body, the third electrode and the fourth electrode being in contact with the first semiconductor layer and the second semiconductor layer, respectively.

17 Claims, 31 Drawing Sheets

(51) Int. Cl.
*H01L 27/15* (2006.01)
*H01L 33/06* (2010.01)
*H01L 33/38* (2010.01)

(58) Field of Classification Search
CPC ....... H01L 33/32; H01L 33/36; H01L 33/382; H01L 33/42
See application file for complete search history.

(56) References Cited

U.S. PATENT DOCUMENTS

| | | | |
|---|---|---|---|
| 9,240,145 B2 | 1/2016 | Ichioka et al. | |
| 9,620,681 B2 | 4/2017 | Yuh | |
| 9,806,233 B2 | 10/2017 | Jung et al. | |
| 9,825,202 B2 | 11/2017 | Schuele et al. | |
| 10,014,442 B2 | 7/2018 | Kim et al. | |
| 10,115,862 B2 | 10/2018 | Zhan et al. | |
| 10,211,364 B2 | 2/2019 | Schuele et al. | |
| 10,243,097 B2 | 3/2019 | Yuen | |
| 10,418,527 B2 | 9/2019 | Sasaki et al. | |
| 10,475,958 B2 | 11/2019 | Zhan et al. | |
| 10,749,083 B2 | 8/2020 | Sasaki et al. | |
| 2007/0090377 A1* | 4/2007 | Lin | H01L 27/153 257/94 |
| 2008/0211416 A1* | 9/2008 | Negley | H01L 33/38 257/E33.001 |
| 2010/0096651 A1* | 4/2010 | Kim | H01L 33/382 257/94 |
| 2019/0181304 A1 | 6/2019 | Sasaki et al. | |
| 2020/0152826 A1 | 5/2020 | Lee et al. | |
| 2020/0203565 A1 | 6/2020 | Ting et al. | |
| 2020/0287088 A1* | 9/2020 | Jeon | H01L 33/62 |
| 2021/0091257 A1 | 3/2021 | Hwang et al. | |
| 2021/0119079 A1 | 4/2021 | Hwang et al. | |
| 2021/0397045 A1 | 12/2021 | Hwang et al. | |
| 2022/0102602 A1 | 3/2022 | Hwang et al. | |
| 2022/0189810 A1 | 6/2022 | Hwang et al. | |

FOREIGN PATENT DOCUMENTS

| | | |
|---|---|---|
| CN | 107768495 A | 3/2018 |
| JP | 5486759 B2 | 5/2014 |
| JP | 2018026396 A | 2/2018 |
| KR | 10-2010-0034797 A | 4/2010 |
| KR | 101040533 B1 | 6/2011 |
| KR | 1020140126009 A | 10/2014 |
| KR | 10-2016-0041417 A | 4/2016 |
| KR | 101622399 B1 | 5/2016 |
| KR | 1020160050228 A | 5/2016 |
| KR | 1020210047695 A | 4/2021 |
| KR | 10-2021-0157093 A | 12/2021 |
| KR | 10-2022-0007500 A | 1/2022 |
| KR | 10-2022-0013739 A | 2/2022 |
| KR | 10-2022-0041484 A | 4/2022 |

OTHER PUBLICATIONS

Communication dated Jul. 15, 2024, issued by the Korean Patent Office in Korean Application No. 10-2021-0058769.
Communication dated Jan. 13, 2025 issued by the State Intellectual Property Office of P.R. China in counterpart Chinese application No. 202210066267.5.

* cited by examiner

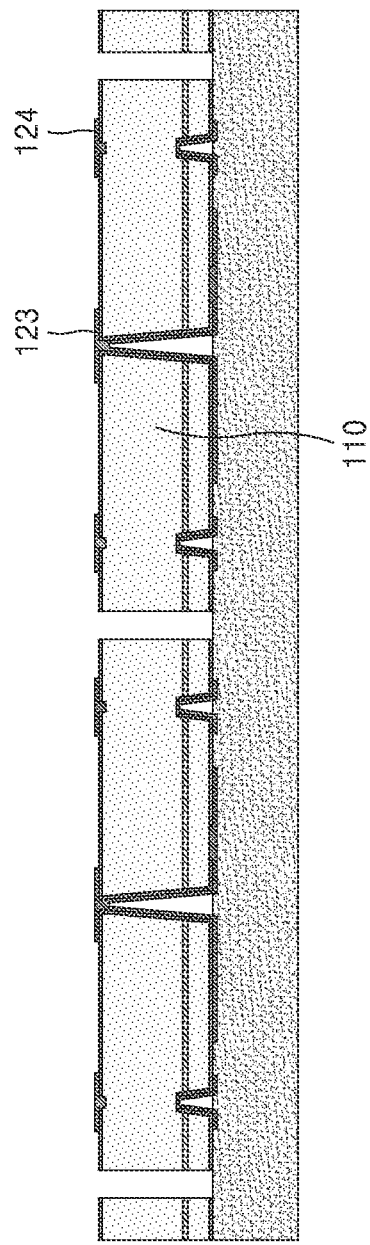

LIGHT-EMITTING DEVICE AND DISPLAY APPARATUS INCLUDING THE SAME

CROSS-REFERENCE TO RELATED APPLICATIONS

This application claims the benefit of U.S. Provisional Application No. 63/145,117, filed on Feb. 3, 2021, in the United States Patent and Trademark Office and Korean Patent Application No. 10-2021-0058769, filed on May 6, 2021, in the Korean Intellectual Property Office, the disclosures of which are incorporated herein in their entireties by reference.

BACKGROUND

1. Field

Example embodiments of the present disclosure relate to a light-emitting device, a display apparatus including the light-emitting device, and methods of manufacturing the light-emitting device and the display apparatus.

2. Description of Related Art

Light-emitting devices (LEDs) are known as the next generation of light sources having advantages such as long lifespan, low power consumption, fast response speed, and environmental friendliness as compared with light sources of the related art, and are used in various products such as illumination devices and backlights of display apparatuses. In particular, group III nitride-based LEDs such as gallium nitride (GaN), aluminum gallium nitride (AlGaN), indium gallium nitride (InGaN), and indium aluminum gallium nitride (InAlGaN) serve as light-emitting devices that output light.

SUMMARY

One or more example embodiments provide a light-emitting device having electrodes arranged on both surfaces thereof and a method of manufacturing the light-emitting device.

One or more example embodiments also provide a display apparatus including a light-emitting device having electrodes arranged on both surfaces thereof and a method of manufacturing the display apparatus.

Additional aspects will be set forth in part in the description which follows and, in part, will be apparent from the description, or may be learned by practice of example embodiments of the disclosure.

According to an aspect of an example embodiment, there is provided a light-emitting device including a body including a first semiconductor layer, an active layer, and a second semiconductor layer, a first electrode and a second electrode provided on a first surface of the body, the first electrode and the second electrode being in contact with the first semiconductor layer and the second semiconductor layer, respectively, and a third electrode and a fourth electrode provided on a second surface of the body, the third electrode and the fourth electrode being in contact with the first semiconductor layer and the second semiconductor layer, respectively.

The light-emitting device may further include a through hole passing through the body, wherein the first electrode is in contact with the third electrode via the through hole.

The light-emitting device may further include a first insulating layer provided on an inner wall of the through hole.

The first insulating layer may extend to the second surface of the body and is in contact with the fourth electrode.

The first electrode may be provided inside of the through hole.

The first electrode may overlap with at least a portion of the third electrode in a thickness direction of the body.

The second electrode may overlap with at least a portion of the fourth electrode in a thickness direction of the body.

The light-emitting device may further include a first trench passing through the first semiconductor layer and the active layer and exposing the second semiconductor layer, wherein the second electrode is in contact with the second semiconductor layer via the first trench.

The light-emitting device may further include a second insulating layer provided on an inner wall of the first trench.

The second insulating layer may extend to the first surface of the body and may be in contact with the first electrode.

The second electrode may be provided inside of the first trench.

At least one of the first electrode, the second electrode, the third electrode, and the fourth electrode may be symmetrical with respect to a central axis of the light-emitting device.

At least one of the first electrode, the second electrode, the third electrode, and the fourth electrode may have a circular cross-sectional shape.

At least one of the first electrode, the second electrode, the third electrode, and the fourth electrode may have a ring cross-sectional shape.

At least one of the first electrode, the second electrode, the third electrode, and the fourth electrode may be transparent.

The light-emitting device may further include a second trench provided between the first electrode and the second electrode in the first surface of the body.

A width of the body in a horizontal direction may be greater than a thickness of the body in a vertical direction.

According to another aspect of an example embodiment, there is provided a display apparatus including a display layer including a plurality of light-emitting devices, and a driving layer including a plurality of transistors electrically connected to the plurality of light-emitting devices, respectively, the driving layer being configured to drive the plurality of light-emitting devices, wherein at least one of the plurality of light-emitting devices includes a body including a first semiconductor layer, an active layer, and a second semiconductor layer, a first electrode and a second electrode provided on an first surface of the body, the first electrode and the second electrode being in contact with the first semiconductor layer and the second semiconductor layer, respectively, and a third electrode and a fourth electrode provided on a second surface of the body, the third electrode and the fourth electrode being in contact with the first semiconductor layer and the second semiconductor layer, respectively.

At least one of the plurality of light-emitting devices may further include a through hole passing through the body, and the first electrode may be in contact with the third electrode via the through hole.

The display apparatus may further include a first insulating layer provided on an inner wall of the through hole.

At least one of the plurality of light-emitting devices may further include a first trench passing through the first semiconductor layer and the active layer and exposing the second semiconductor layer, and the second electrode may be in contact with the second semiconductor layer via the first trench.

The display apparatus may further include a second insulating layer provided on an inner wall of the first trench.

One of the first electrode and the third electrode may be electrically connected to the driving layer, and one of the second electrode and the fourth electrode may be electrically connected to the driving layer.

According to another aspect of an example embodiment, there is provided a light-emitting device including a body including a first semiconductor layer, an active layer, and a second semiconductor layer, a first electrode and a second electrode provided on a first surface of the body, the first electrode and the second electrode being in contact with the first semiconductor layer and the second semiconductor layer, respectively, a third electrode and a fourth electrode provided on a second surface of the body, the third electrode and the fourth electrode being in contact with the first semiconductor layer and the second semiconductor layer, respectively, and a through hole passing through the body, wherein the first electrode is in contact with the third electrode via the through hole, and wherein the first electrode overlaps with at least a portion of the third electrode in a thickness direction of the body.

BRIEF DESCRIPTION OF THE DRAWINGS

The above and/or other aspects, features, and advantages of example embodiments of the disclosure will be more apparent from the following description taken in conjunction with the accompanying drawings, in which:

FIGS. 2A, 2B, 2C, 2D, 2E, 2F, and 2G are diagrams illustrating a method of manufacturing a light-emitting device according to an example embodiment;

DETAILED DESCRIPTION

Figure 1A:
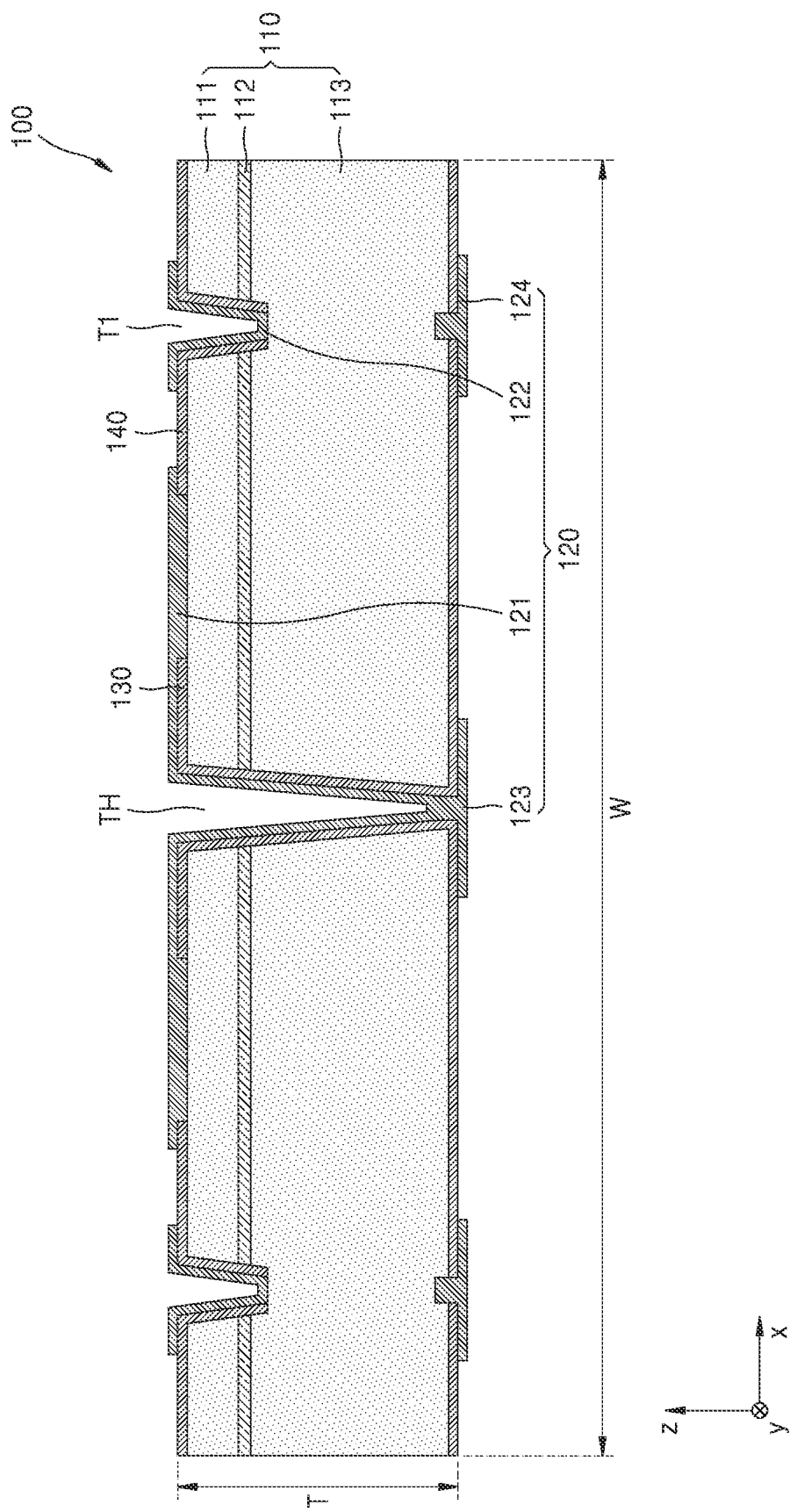
FIG. 1A is a cross-sectional view of a light-emitting device according to an example embodiment.

Reference will now be made in detail to example embodiments of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, example embodiments will be described in detail with reference to the accompanying drawings. The example embodiments described are merely examples, and various modifications may be possible from the example embodiments. Like reference numerals in the drawings below refer to like elements, and the size of each element in the drawings may be exaggerated for clarity and convenience of explanation.

Hereinafter, the expression "above" or "on" may include not only "immediately on in a contact manner" but also "on in a non-contact manner".

Although the terms "first," "second," etc. may be used to describe various elements, these terms are used only for the purpose of distinguishing one element from another. These terms do not limit the difference between materials or structures of the elements.

An expression used in the singular encompasses the expression of the plural, unless it has a clearly different meaning in the context. It will be further understood that when a part "includes" or "comprises" an element, the part may further include other elements, not excluding the other elements, unless defined otherwise.

Also, the terms " . . . unit," "module," etc. used in the specification indicate an unit that processes at least one function or motion, and the unit may be implemented by hardware or software, or by a combination of hardware and software.

The use of term "the" and other similar determiners may correspond to both a singular form and a plural form.

Unless orders of operations included in a method are specifically described, the operations may be performed according to appropriate orders. Also, the use of all example terms (e.g., etc.) are merely for describing the disclosure in detail and the disclosure is not limited to the examples and the example terms, unless they are not defined in the scope of the claims.

Figure 1B:
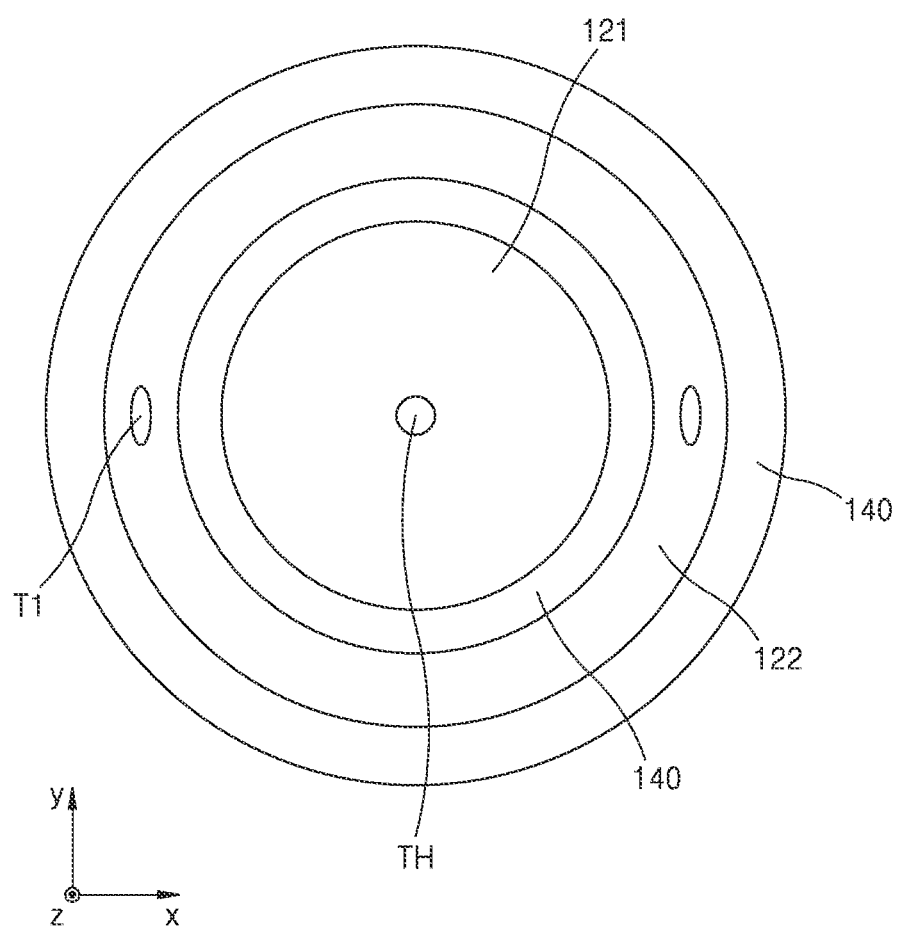
FIG. 1B is a diagram illustrating an upper surface of the light-emitting device of FIG. 1A.
Figure 1C:
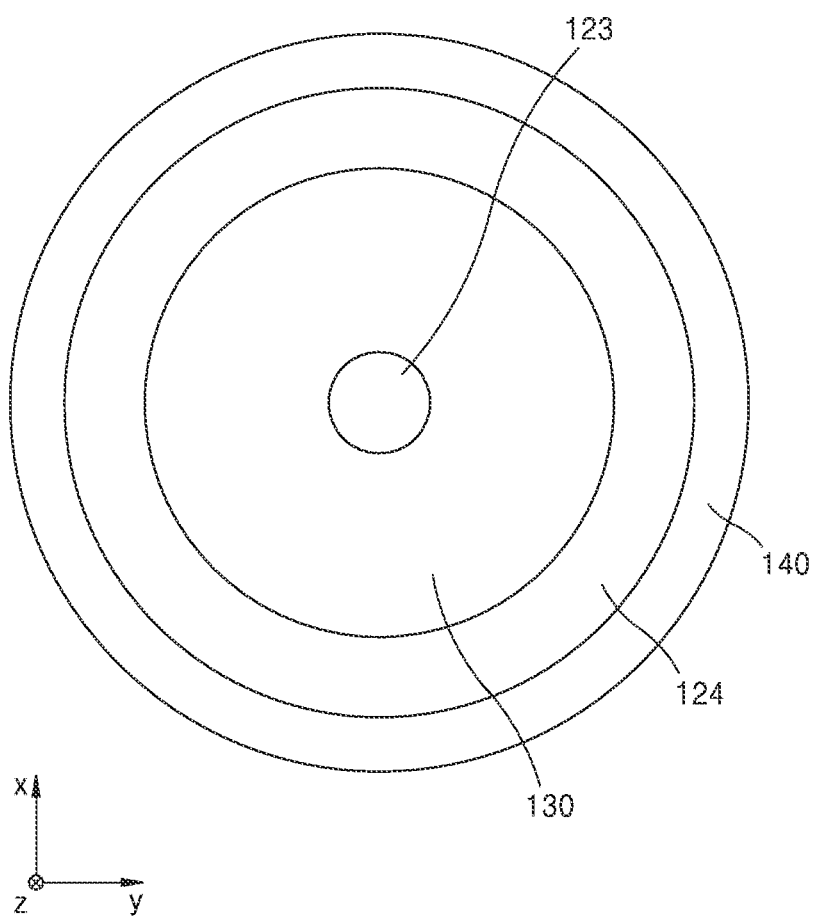
FIG. 1O is a diagram illustrating a lower surface of the light-emitting device of FIG. 1A.
Figure 10:
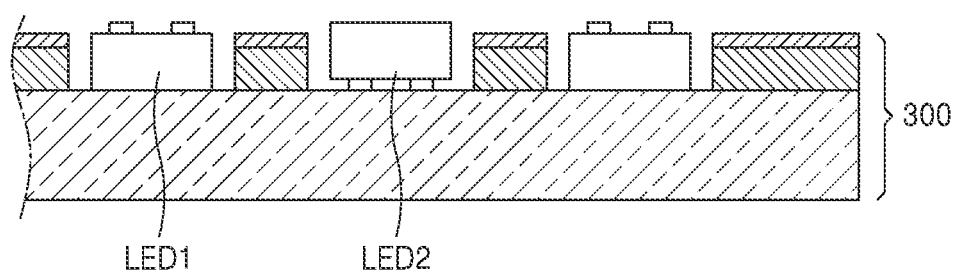
FIG. 10 is a diagram illustrating, as a related example, a state in which a light-emitting device having electrodes arranged on only one surface thereof is transferred to a transfer substrate.

FIG. 1A is a cross-sectional view of a light-emitting device 100 according to an example embodiment, FIG. 1B is a diagram illustrating an upper surface of the light-emitting device 100 of FIG. 1A, and FIG. 10 is a diagram illustrating a lower surface of the light-emitting device 100 of FIG. 1A.

As shown in FIG. 1A, the light-emitting device 100 may include an inorganic material-based light-emitting diode, and may emit light of a specific wavelength according to a material included in the light-emitting device 100. The light-emitting device 100 may include a body 110 including a plurality of semiconductor layers and an electrode portion 120 applying an electrical signal to the body 110. The light-emitting device 100 according to an example embodiment may be micro-sized. For example, a width W of the light-emitting device 100 may be less than or equal to 500 µm, or less than or equal to 100 µm.

The body 110 may have a flat shape in which a width W is greater than a thickness T. A cross-section parallel to a width W direction of the body 110, that is, a traverse section, may be, for example, circular, elliptical and/or polygonal. A cross-section parallel to a thickness T direction of the body 110 may have a quadrangular shape. For example, a side cross-section of the body 110 may be rectangular.

The body 110 may include a first semiconductor layer 111, an active layer 112, and a second semiconductor layer 113.

The first semiconductor layer 111 may include, for example, a p-type semiconductor. However, embodiments are not limited thereto. The first semiconductor layer 111 may include an n-type semiconductor. The first semiconductor layer 111 may include a group III-V-based p-type semiconductor, for example, p-GaN. The first semiconductor layer 111 may have a single-layer or multi-layer structure. For example, the first semiconductor layer 111 may include any one semiconductor material of InAlGaN, GaN, AlGaN, InGaN, aluminum nitride (AlN), and indium nitride (InN), and may include a semiconductor layer doped with a conductive dopant such as silicon (Si), germanium (Ge), tin (Sn), etc.

The active layer 112 may be arranged on a lower surface of the first semiconductor layer 111. The active layer 112 may generate light when electrons combine with holes, and may have a multi-quantum well (MQW) structure or a single-quantum well (SQW) structure. The active layer 112 may include a group III-V-based semiconductor such as InGaN, GaN, AlGaN, aluminum indium gallium nitride (AlInGaN), etc. A clad layer doped with a conductive dopant may be formed on an upper portion and/or a lower portion of the active layer 112. For example, the clad layer may include an AlGaN layer or an InAlGaN layer.

The second semiconductor layer 113 may be provided on a lower surface of the active layer 112, and may include a semiconductor layer of a different type from the first semiconductor layer 111. For example, the second semiconductor layer 113 may include an n-type semiconductor layer. The second semiconductor layer 113 may include, for example, InAlGaN, GaN, AlGaN, and/or InGaN, and may be a semiconductor layer doped with a conductive dopant such as magnesium (Mg), etc.

The electrode portion 120 may include a first electrode 121 and a second electrode 122 arranged on the upper surface of the body 110 and in contact with the first and second semiconductor layers 111 and 113, respectively, and may further include a third electrode 123 and a fourth electrode 124 arranged on the lower surface of the body 110 and in contact with the first and second semiconductor layers 111 and 113, respectively.

As shown in FIGS. 1A to 10, at least one of the first to fourth electrodes 121, 122, 123, and 124 may be symmetrical with respect to a central axis X of the light-emitting device 100. The first electrode 121 may be arranged to overlap with at least a portion of the third electrode 123 in the thickness T direction of the body 110, and the second electrode 122 may overlap with at least a portion of the fourth electrode 124 in the thickness T direction of the body 110.

Because the first to fourth electrodes 121, 122, 123, and 124 of a symmetric structure are arranged on both surfaces of the light-emitting device 100, when transferring the light-emitting device 100 to another substrate, there may be no need to consider which surface of the light-emitting device 100 is arranged on the substrate. This may reduce transfer defects of the light-emitting device 100, thereby increasing a transfer yield.

The first to fourth electrodes 121, 122, 123, and 124 may be transparent electrodes. For example, the first to fourth electrodes 121, 122, 123, and 124 may be formed of a transparent conductive material. Because the first to fourth electrodes 121, 122, 123, and 124 are arranged on both surfaces of the light-emitting device 100, light generated in the active layer 112 may pass through the first to fourth electrodes 121, 122, 123, and 124 to be emitted to the outside. Thus, a decrease in emission efficiency of the light-emitting device 100 may be prevented. The first to fourth electrodes 121, 122, 123, and 124 may include metal such as silver (Ag), magnesium (Mg), aluminum (Al), platinum (Pt), palladium (Pd), gold (Au), nickel (Ni), neodymium (Nd), iridium (Ir), chromium (Cr), and alloys thereof, conductive oxide such as indium tin oxide (ITO), indium zinc oxide (IZO), zinc oxide (ZnO), and indium tin zinc oxide (ITZO), conductive polymer such as PEDOT, etc.

The light-emitting device 100 may further include a through hole TH passing through the body 110, that is, through the first semiconductor layer 111, the active layer 112, and the second semiconductor layer 113. The through hole TH may be arranged at a center of the light-emitting device 100, and the first electrode 121 may be in contact with the third electrode 123 through the through hole TH. The through hole TH may have a tapered shape in which the width W narrows from the first semiconductor layer 111 toward the second semiconductor layer 113. However, embodiments are not limited thereto. The through hole TH may have the same width W from the first semiconductor layer 111 toward the second semiconductor layer 113 or vice versa.

The light-emitting device 100 may further include a first insulating layer 130 surrounding an inner wall of the through hole TH. One end of the first insulating layer 130 may extend to the upper surface of the body 110, and the other end of the first insulating layer 130 may extend to the lower surface of the body 110 to be in contact with the fourth electrode 124. Thus, the first insulating layer 130 may prevent the first electrode 121 from being in contact with the active layer 112 and the second semiconductor layer 113 via the through hole TH, and may prevent the third electrode 123 from being in contact with the second semiconductor layer 113.

The light emitting-device 100 may further include a first trench T1 passing through only a portion of the body 110. For example, the first trench T1 may pass through the first semiconductor layer 111 and the active layer 112 to expose the second semiconductor layer 113. In addition, the second electrode 122 may be in contact with the second semiconductor layer 113 via the first trench T1. An edge region of the second electrode 122 may be arranged on the upper surface of the body 110, and a middle region of the second electrode 122 may be in contact with the second semiconductor layer 113 via the first trench T1.

In the drawings, two first trenches T1 are arranged at equal intervals with the through hole TH therebetween. However, embodiments are not limited thereto. There may be two or more first trenches T1. For example, when there are three first trenches T1, the three trenches T1 may be arranged to be rotationally symmetrical by 120 degrees with respect to the central axis X of the light-emitting device 100.

The light-emitting device 100 may further include a second insulating layer 140 surrounding the inner wall of the first trench T1. The second insulating layer 140 may include a hole that exposes the second semiconductor layer 113 while surrounding the inner wall of the first trench T1, and may extend to the upper surface of the body 110 to be in contact with the first electrode 121. Thus, the second insulating layer 140 may cause a portion of the second electrode 122 to be in contact with the second semiconductor layer 113 through the first trench T1, and may prevent the remaining portion of the second electrode 122 from being in contact with the first semiconductor layer 111 and the active layer 112.

The first electrode 121 may have a circular shape that protrudes convexly along the through hole TH, and the second electrode 122 may have a ring shape that protrudes convexly along the first trench T1. The third electrode 123 may have a circular shape, and the fourth electrode 124 may have a ring shape.

FIGS. 2A to 2G are diagrams illustrating a method of manufacturing the light-emitting device 100 according to an example embodiment.

Figure 2A:
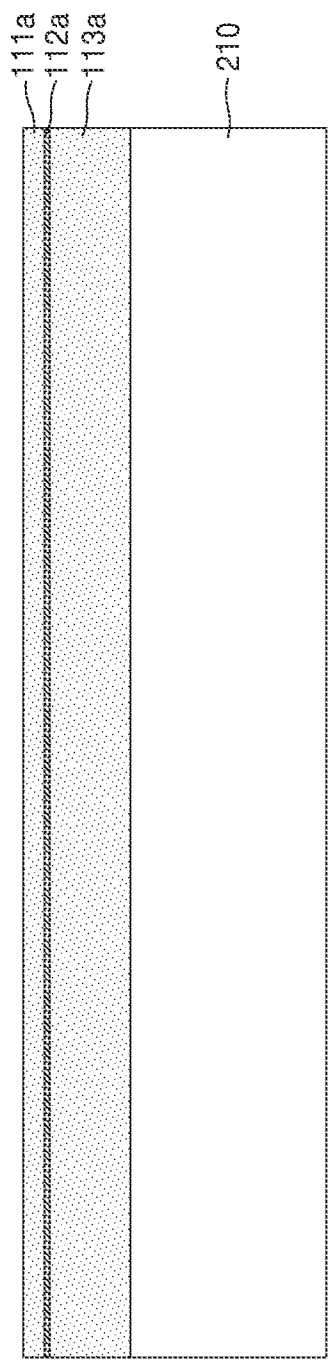

As shown in FIG. 2A, a second semiconductor material layer 113a, an active material layer 112a, and a first semiconductor material layer 111a may be sequentially formed on a first substrate 210. The first substrate 210 may be a substrate for growing the light-emitting device 100. The first substrate 210 may include various materials used in a general semiconductor process. For example, a silicon substrate or a sapphire substrate may be used as the first substrate 210.

The second semiconductor material layer 113a, the active material layer 112a, and the first semiconductor material layer 111a may be formed by methods such as metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE), etc.

Figure 2B:
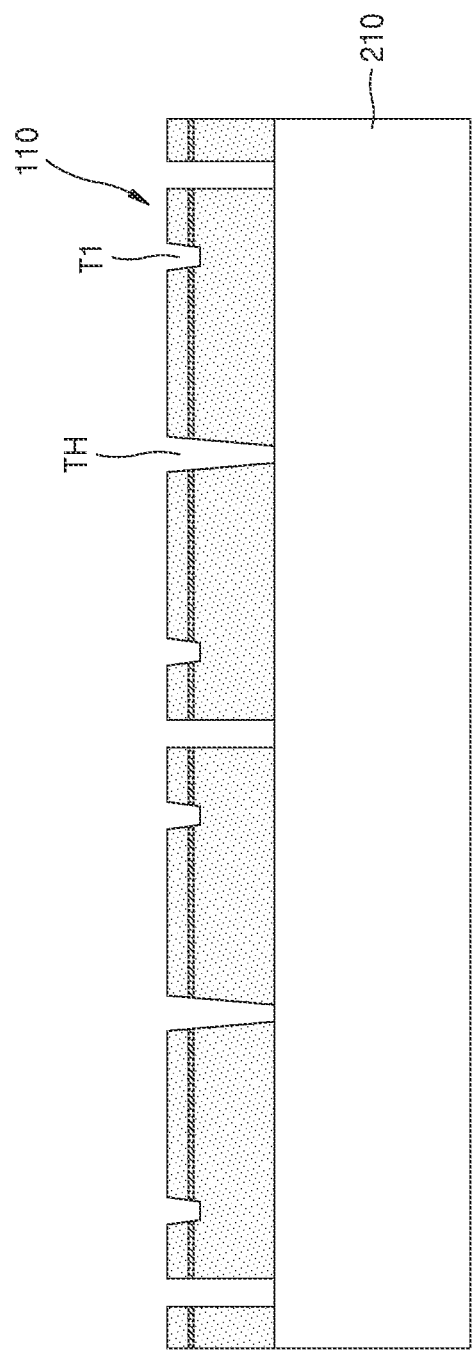

As shown in FIG. 2B, the second semiconductor material layer 113a, the active material layer 112a, and the first semiconductor material layer 111a may be patterned to form the body 110 having the through hole TH and the first trench T1. The first substrate 210 may be exposed by the through hole TH, and the second semiconductor material layer 113a may be exposed by the first trench T1. Cross-sections of the through hole TH and the first trench T1 may be circular, elliptical and/or polygonal. In FIG. 2A, one through hole TH and two first trenches T1 per body 110 are shown, but embodiments are not limited thereto. The numbers of through holes TH and first trenches T1 may vary.

Figure 2C:
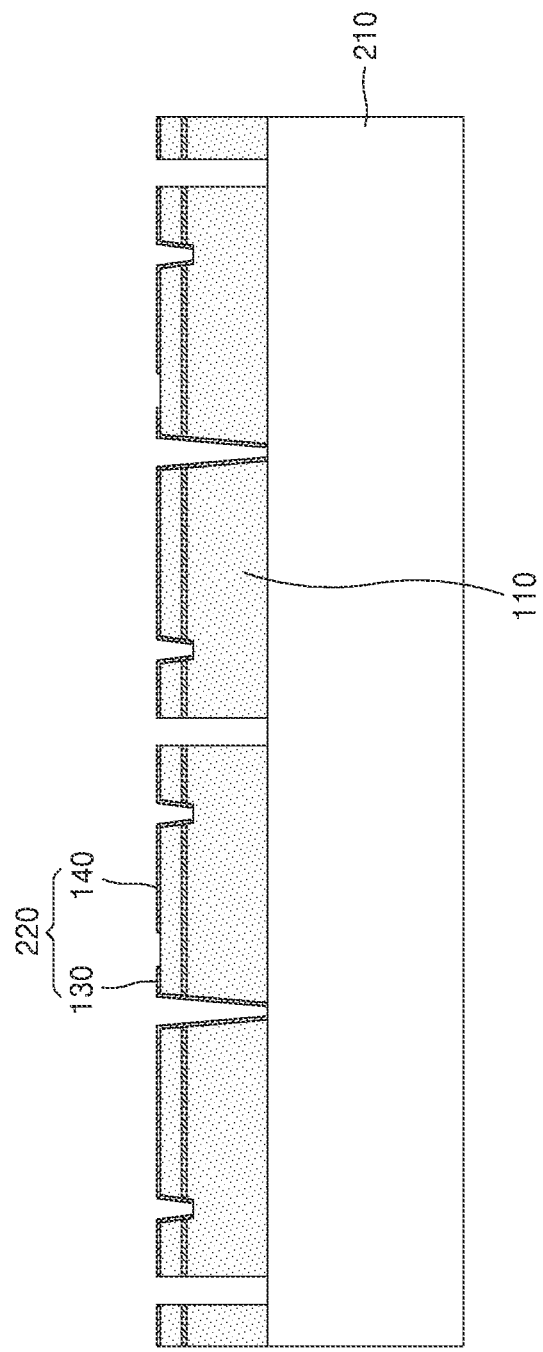

As shown in FIG. 2C, a first insulating pattern 220 may be formed on the body 110. The first insulating pattern 220 may be formed on the upper surface of the body 110. The first insulating pattern 220 may extend to a side surface of the through hole TH and a side surface of the first trench T1, the first substrate 210 may be exposed by the through hole TH, and the second semiconductor layer 113 may be exposed by the first trench T1. A portion of the first insulating pattern 220 may be part of the first insulating layer 130 of FIG. 1, and the remaining portion of the first insulating pattern 220 may be part of the second insulating layer 140.

Figure 2D:
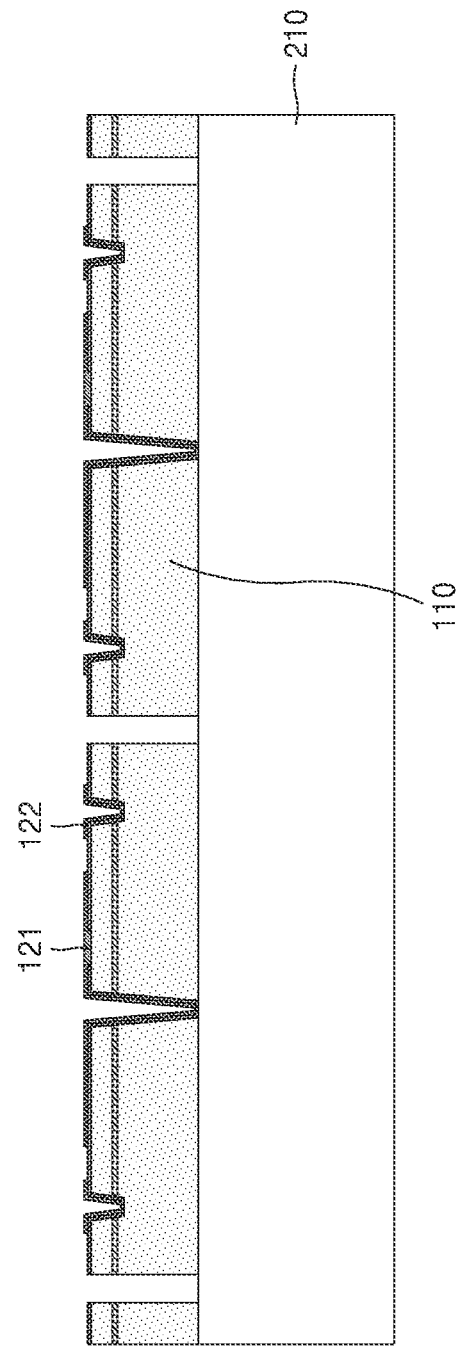

As shown in FIG. 2D, the first and second electrodes 121 and 122 may be formed on the body 110. The first electrode 121 may be formed to pass through bottom and side surfaces of the through hole TH and extend to the upper surface of the body 110. The second electrode 122 may be formed to pass through bottom and side surfaces of the first trench T1 and extend to the upper surface of the body 110, while being spaced apart from the first electrode 121.

Figure 2E:
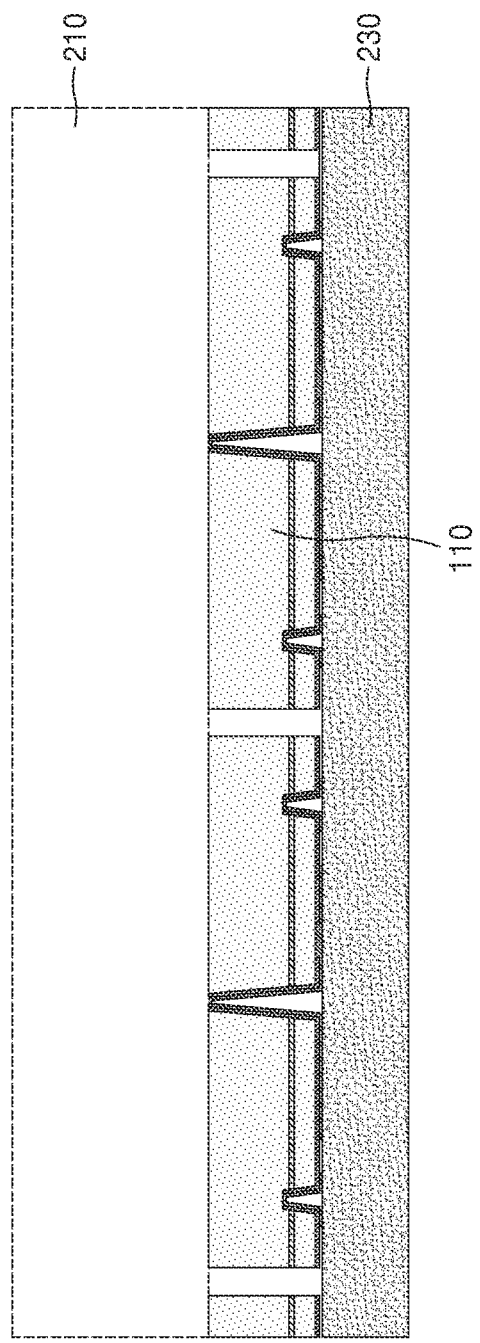

As shown in FIG. 2E, the body 110 having the first and second electrodes 121 and 122 formed thereon may be transferred to a second substrate 230 to expose the lower surface of the body 110. The second substrate 230 may include an insulating material such as glass, organic polymer, crystal, etc. Further, the second substrate 230 may include a flexible material to bend or fold, and may have a single-layer structure or a multi-layer structure.

For example, the second substrate 230 is arranged on the upper surface of the body 110. Then, after the upper and lower positions of the first and second substrates 210 and 230 are changed, the first substrate 210 may be removed from the body 110 by, for example, a laser lift-off method, a chemical lift-off method, or a grinding method.

Figure 2F:
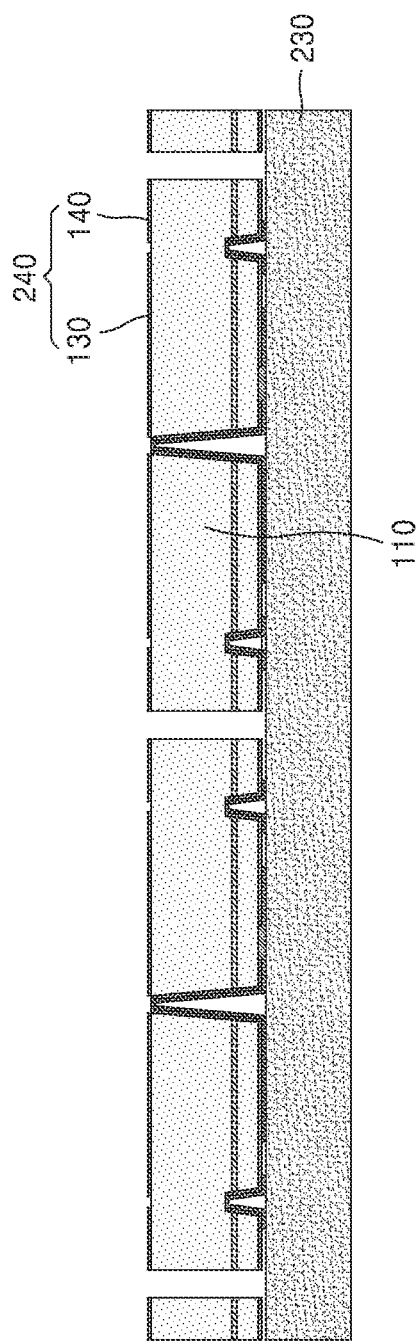

As shown in FIG. 2F, a second insulating pattern 240 may be formed on the lower surface of the body 110. The second insulating pattern 240 may be formed such that a portion of the second semiconductor layer 113 and a portion of the first electrode 121 are exposed. The second insulating pattern 240 may be part of the first and second insulating layers 130 and 140 described with reference to FIG. 1.

As shown in FIG. 2G, the third and fourth electrodes 123 and 124 may be formed on the lower surface of the body 110. The third electrode 123 may be formed to overlap with at least a portion of the first electrode 121 in the thickness T direction of the body 110 while being in contact with the first electrode 121. The fourth electrode 124 may be formed to be in contact with the second semiconductor layer 113 while being spaced apart from the third electrode 123 in the width W direction of the body 110. Further, the fourth electrode 124 may be formed to overlap with at least a portion of the second electrode 122 in the thickness T direction of the body 110. The light-emitting device 100 completed may be separated from the second substrate 230 to be transferred to another substrate.

As described above, because the first to fourth electrodes 121, 122, 123, and 124 are arranged on both the upper surface and the lower surface of the body 110, there may be no need to consider the positions of the electrodes when transferring the light-emitting device 100 to another substrate. Thus, a defective rate of transfer of the light-emitting device 100 may be reduced.

Figure 3:
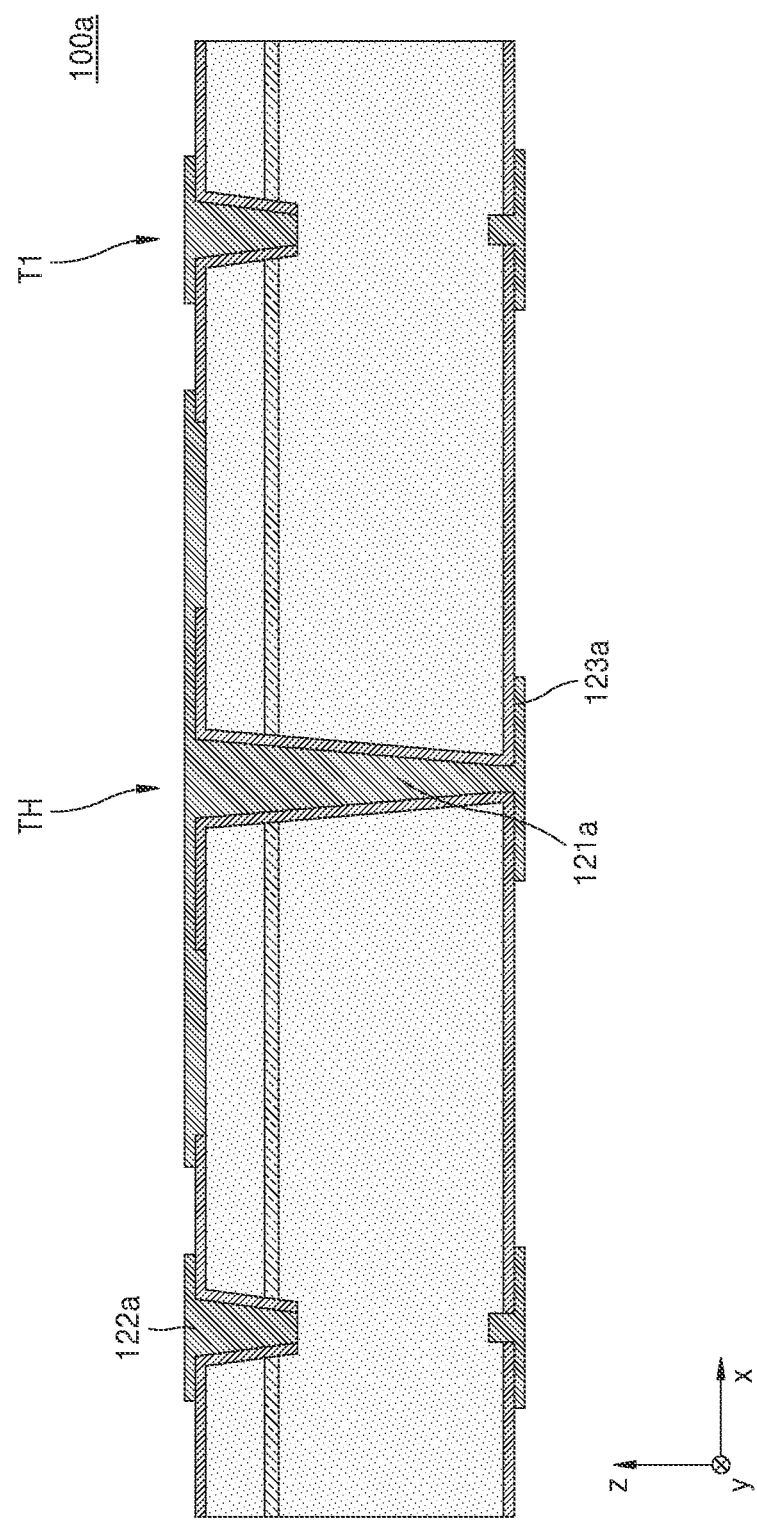
FIG. 3 is a diagram illustrating a light-emitting device according to another example embodiment.

FIG. 3 is a diagram illustrating a light-emitting device 100a according to another example embodiment. Compared to FIGS. 1 and 3, the through hole TH of the light-emitting device 100a of FIG. 3 may be filled with a first electrode 121a, and the first trench T1 may be filled with a second electrode 122a. When the through hole TH is emptied in the manufacturing process of the light-emitting device 100a, a connecting portion between the first electrode 121a and a third electrode 123a may be formed of a thin insulating layer and an electrode thin-film such that mechanical strength may be weakened. By filling the through hole TH with the first electrode 121a, the weakening of the strength of the light-emitting device 100a due to the through hole TH may be prevented or reduced. Similarly, the inside of the first trench T1 being filled with the second electrode 122a may prevent the weakening of the strength of the light-emitting device 100a.

Figure 4:
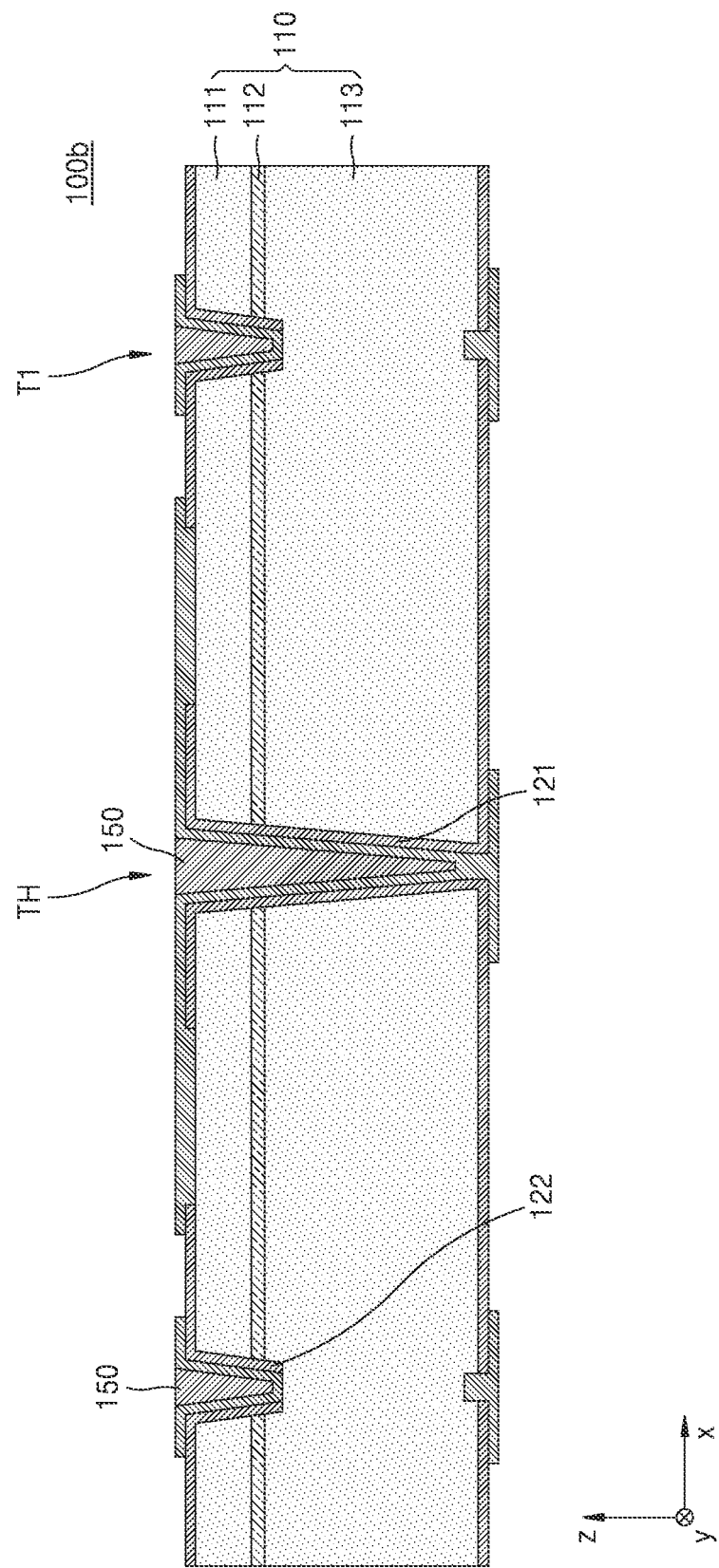
FIG. 4 is a diagram illustrating a light-emitting device according to another example embodiment.

FIG. 4 is a diagram illustrating a light-emitting device 100b according to another example embodiment. Upon comparing FIGS. 1 and 4, the light-emitting device 100b of FIG. 4 may further include an insulating material 150 that fills spaces in the through hole TH and the first trench T1. When the through hole TH is filled with transparent insulating material 150, an emission area may be increased as compared with an example embodiment in which the through hole TH is filled with an electrode material, and thus, a decrease in emission efficiency may be prevented or reduced.

Figure 5:
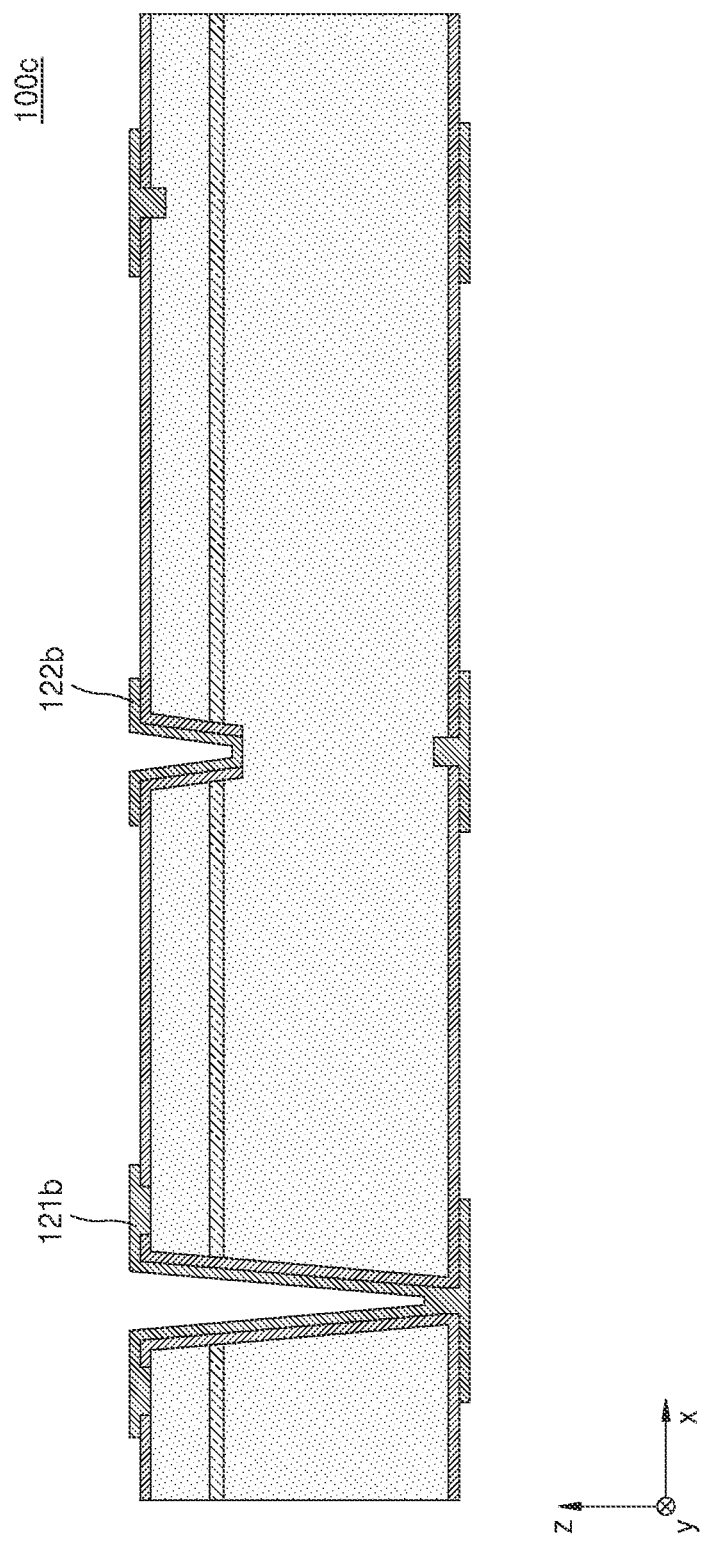
FIG. 5 is a diagram illustrating a light-emitting device according to another example embodiment.

The through hole TH may not be arranged on a central axis X of the light-emitting device 100b. FIG. 5 is a diagram illustrating a light-emitting device 100c according to another example embodiment. As shown in FIG. 5, the through hole TH may be arranged in an edge region of the light-emitting device 100c, and a first electrode 121b may have a ring shape. A second electrode 122b may be arranged on a central axis X of the light-emitting device 100c, and may have a circular shape. Because the through hole TH is arranged on the edge of the light-emitting device 100c, a larger emission area of the active layer 112 may be secured.

Figure 6:
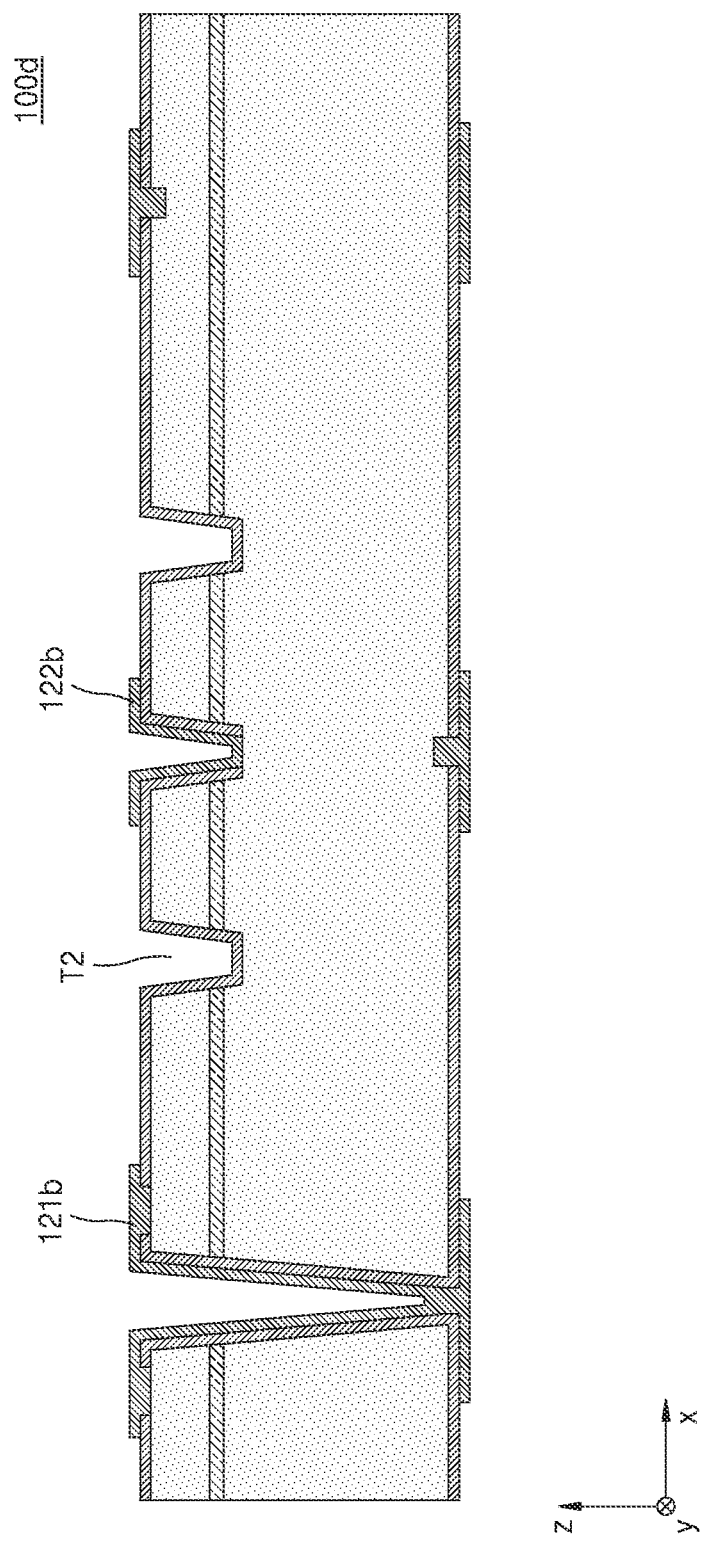
FIG. 6 is a diagram illustrating a light-emitting device according to another example embodiment.

FIG. 6 is a diagram illustrating a light-emitting device 100d according to another example embodiment. The light-emitting device 100d of FIG. 6 may further include a second trench T2 between the first electrode 121b and the second electrode 122b. The second trench T2 may have a ring shape. The second trench T2 may prevent the first and second electrodes 121b and 122b from being short-circuited. In FIG. 6, the second trench T2 is arranged between the first and second electrodes 121b and 122b, but embodiments are not limited thereto. The second trench T2 may be arranged between the third and fourth electrodes 123 and 124. Further, the second trench T2 may have a ring shape, or may have a shape including a plurality of grooves H that are apart from each other.

Figure 7:
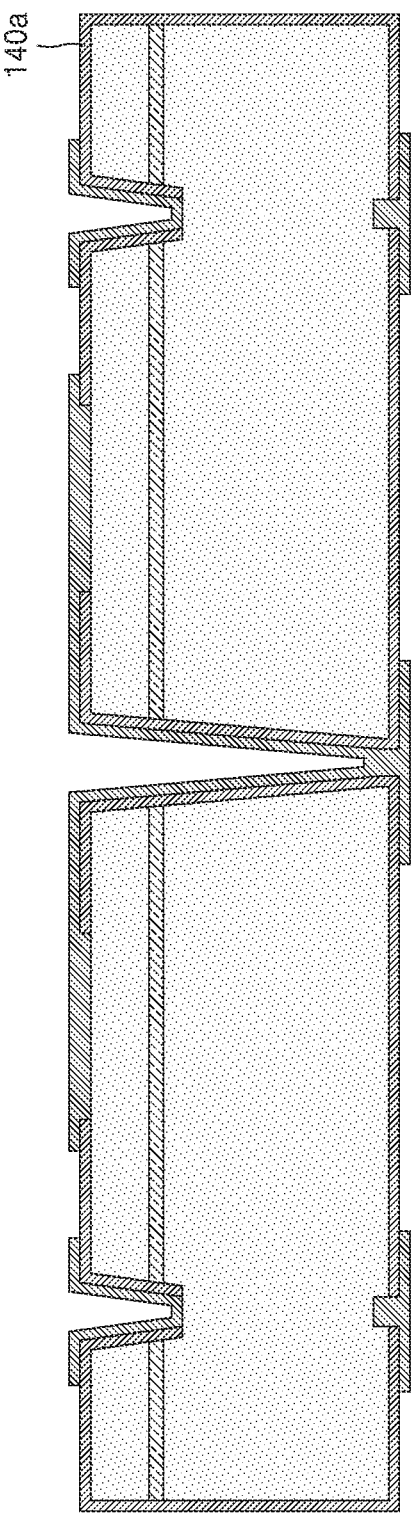
FIG. 7 is a diagram illustrating a light-emitting device according to another example embodiment.

FIG. 7 is a diagram illustrating a light-emitting device 100e according to another example embodiment. A second insulating layer 140a included in the light-emitting device 100e of FIG. 7 may surround a side surface of the body 110. The second insulating layer 140a may not only electrically insulate between the second and fourth electrodes 122 and 124 and the body 110, but may also be a protective film for protecting the body 110 from the outside.

Figure 8:
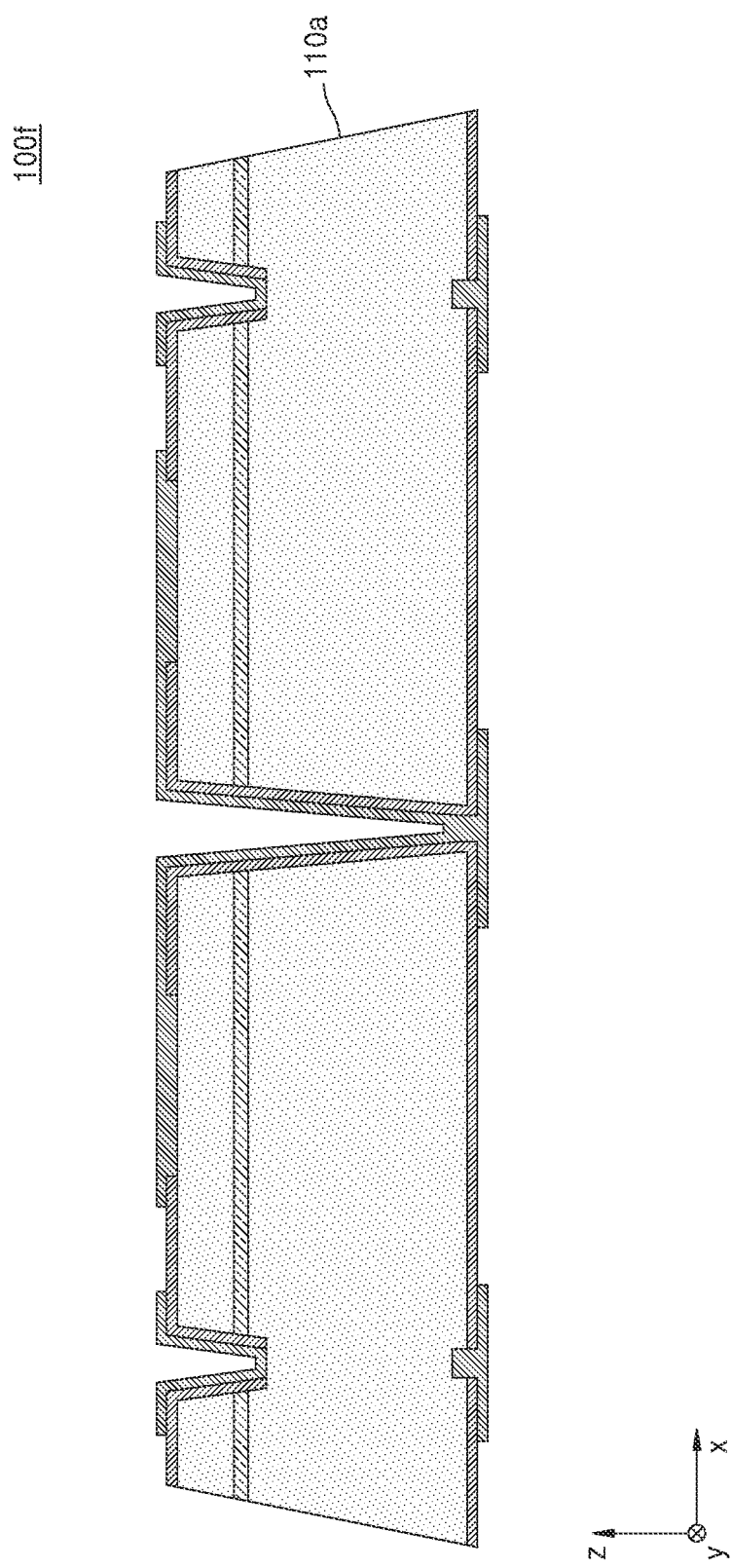
FIG. 8 is a diagram illustrating a light-emitting device according to another example embodiment.

FIG. 8 is a diagram illustrating a light-emitting device 100f according to another example embodiment. A body 110a included in the light-emitting device 100f of FIG. 8 may have an increasing width from an upper portion toward a lower portion thereof. As described above, by varying widths of the upper surface and the lower surface of the body 110f, when transferring the light-emitting device 100f, the light-emitting device 100f may be induced to be transferred in a specific direction. For example, in a case where a width of the body 110f increases from the upper portion toward the lower portion thereof, when transferring the light-emitting device 100f, the third and fourth electrodes 123 and 124 of the light-emitting device 100f may be induced to be arranged in the lower portion of the light-emitting device 100f.

As described above, because the electrodes are arranged on both the upper surface and the lower surface of the body, the light-emitting device 100, 100a, 100b, 100c, 100d. 100e, 100f may be transferred without considering the positions of the electrodes included in the light-emitting device. Thus, a defective rate of the light-emitting device 100, 100a, 100b, 100c, 100d. 100e, 100f during transfer may be reduced.

Figure 9A:
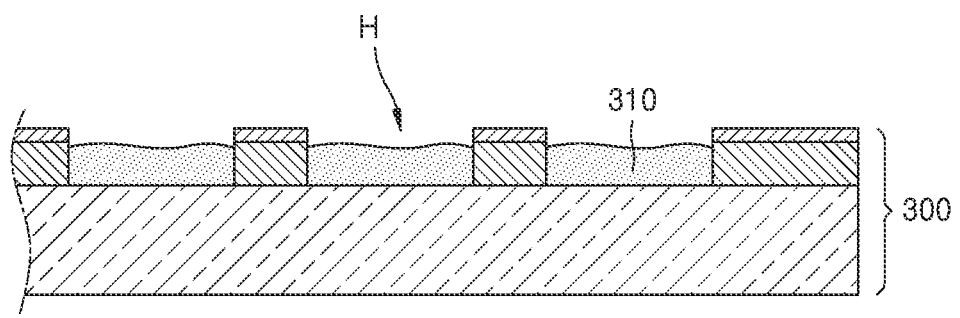
FIGS. 9A, 9B, and 9C are diagrams illustrating a method of transferring a light-emitting device to a transfer substrate according to an example embodiment.
Figure 9B:
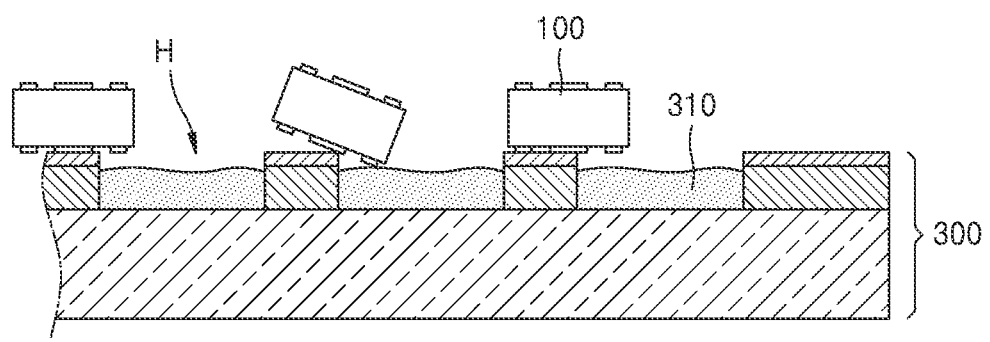
Figure 9C:
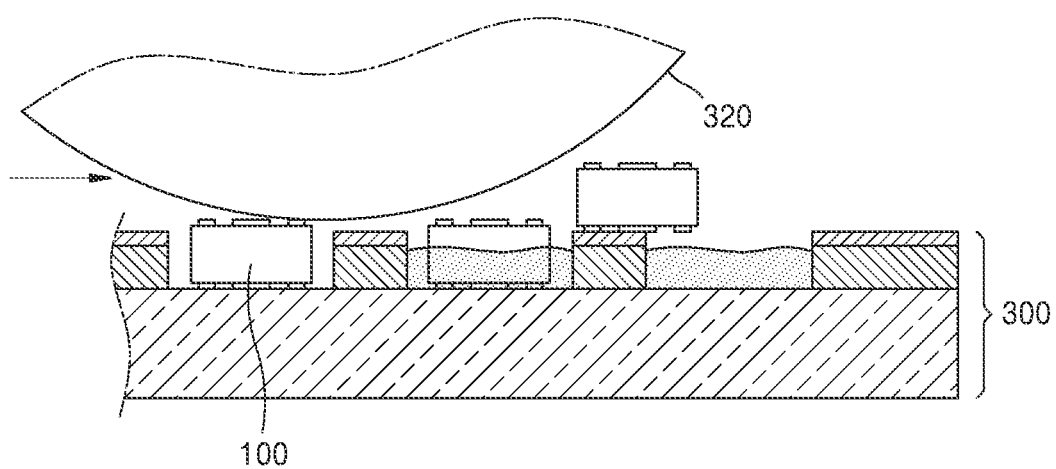

FIGS. 9A to 9C are diagrams illustrating a method of transferring the light-emitting device 100 to a transfer substrate 300, according to an example embodiment.

As shown in FIG. 9A, a liquid 310 may be supplied to the transfer substrate 300. The transfer substrate 300 may be a single body including a plurality of grooves H or a substrate having a single mold structure. The transfer substrate 300 may include, for example, an organic material, such as silicon, glass, sapphire, and polymer, an inorganic material, and/or a metal, and may be manufactured by photoresist patterning, etching, molding, etc., but the present disclosure is not limited thereto. When the light-emitting device 100 is transferred to the transfer substrate 300, the groove H may serve a role of guiding the transfer of the light-emitting device 100.

The groove H may have a cross-sectional area greater than the area of the light-emitting device 100 to accommodate the light-emitting device 100. The groove H may have an area capable of containing only one light-emitting device 100, or may have an area capable of containing a plurality of light-emitting devices 100. The groove H may have a shape similar to the cross-section of the light-emitting device 100, for example, a circular cross-section or a polygonal cross-section. The groove H may have a depth less or greater than the thickness of the light-emitting device 100, for example, a depth less than twice the thickness of the light-emitting device 100, or a depth in a range of 0.5 to 1.5 times the thickness of the light-emitting device 100. A bottom surface of the groove H may have a roughness of 50 nm or less.

As the liquid 310, any type of liquid may be used as long as the liquid 310 does not corrode or damage the light-emitting device 100. The liquid 310 may include, for example, one or a plurality of combinations from the group including water, ethanol, alcohol, polyol, ketone, halocarbon, acetone, a flux, and an organic solvent. The organic solvent may include, for example, isopropyl alcohol (IPA). The liquid 310 that may be used is not limited thereto, and various modifications may be made.

A method of supplying the liquid 310 to the transfer substrate 300 may include, for example, a spraying method, a dispensing method, an inkjet dot method, a method of spilling the liquid 310 onto the transfer substrate 300, etc., which will be described later. The amount of the liquid 310 that is supplied may be variously adjusted to rightly fit the groove H or to spill over from the groove H.

As shown in FIG. 9B, a plurality of light-emitting devices 100 may be supplied to the transfer substrate 300. The light-emitting device 100 may be directly sprayed onto the transfer substrate 300 without another liquid 310, or may be supplied while being included in a suspension. A method of supplying the light-emitting device 100 included in the suspension may include various methods such as a dispensing method for dropping the liquid 310, an inkjet dot method for discharging the liquid 310, such as a printing method, a method of spilling the suspension onto the transfer substrate 300, etc.

The supplying of the liquid 310 to the groove H of the transfer substrate 300 and the supplying of the light-emitting device 100 to the transfer substrate 300 may be performed in the reverse order to the order described with reference to FIGS. 9A and 9B. Further, the supplying of the liquid 310 to the groove H of the transfer substrate 300 and the supplying of the light-emitting device 100 to the transfer substrate 300 may be performed simultaneously in one operation. For example, by supplying the suspension including the light-emitting device 100 to the transfer substrate 300, the liquid 310 and the light-emitting device 100 may be simultaneously supplied to the transfer substrate 300.

As shown in FIG. 9C, the transfer substrate 300 is scanned using an absorber 320 capable of absorbing the liquid 310. The absorber 320 may include all kinds of materials capable of absorbing the liquid 310, and a shape or a structure of the absorber 320 is not limited to particular types. The absorber 320 may include, for example, fabric, tissue, polyester fiber, paper, a wiper, etc. Although the absorber 320 may be used independently without an auxiliary device, in some embodiments, the absorber 320 may be coupled to a support to facilitate scanning of the transfer substrate 300. The support may have various forms and structures suitable for scanning the transfer substrate 300. The support may have, for example, a shape such as a rod, a blade, a plate, or a wiper. The absorber 320 may be provided on a surface of the support, or may surround a perimeter of the support.

The scanning may include absorbing the liquid 310 while the absorber 320 contacts the transfer substrate 300 and passes through the plurality of grooves H. The scanning may be performed, for example, by various methods such as a sliding method, a rotating method, a translating movement method, a reciprocating movement method, a rolling method, a spinning method, and/or a rubbing method of the absorber 320, and may include both a regular method and an irregular method.

The scanning may be performed by moving the transfer substrate 300 instead of moving the absorber 320, and the scanning of the transfer substrate 300 may also be performed by a sliding, rotating, translating, reciprocating, rolling, spinning, and/or rubbing method, etc. The scanning may be performed via cooperation of the absorber 320 and the transfer substrate 300.

In the scanning process, the light-emitting device 100 may be seated in the groove H due to a difference in surface energy or a complementary shape between the groove H and the light-emitting device 100. Because the light-emitting device 100 has electrodes arranged on both the upper surface and the lower surface thereof, the light-emitting device 100 may be seated in a forward direction or in a reverse direction.

After the absorber 320 scans the transfer substrate 300, a dummy light-emitting device remaining in the transfer substrate 300 may be removed without entering the groove H. The operations described with reference to FIGS. 9A to 9C may be repeated, and through these operations, the light-emitting device 100 may be rapidly transferred to the transfer substrate 300.

FIG. 10 is a diagram illustrating, as a related example, a state in which light-emitting devices LED1 and LED2 having electrodes arranged on only one surface thereof are transferred to the transfer substrate 300. Due to a difference in surface energy between the transfer substrate 300 and the light-emitting devices LED1 and LED2, the light-emitting devices LED1 and LED2 may be seated in the groove H. In general, the electrodes of the light-emitting device LED1 may be arranged towards the outside of the groove H of the transfer substrate 300. This is because an upper surface of the transfer substrate 300 except for the groove H and the electrodes of the light-emitting device LED1 may be hydrophobic, while the bottom surface of the groove H of the transfer substrate 300 may be hydrophilic. However, when adjustment of the difference in the surface energy fails, the electrodes of the light-emitting device LED2 may be arranged towards the bottom surface of the groove H. The light-emitting device LED2 is defectively transferred, and may need to be repaired.

However, because the light-emitting device 100 according to an example embodiment has electrodes arranged on both surfaces thereof, defects may not occur even when the light-emitting device 100 is transferred upside down. Thus, a repair operation may be omitted, and costs and time may be saved.

In FIGS. 9A to 9C, the light-emitting device 100 is transferred by a fluidic self-assembly method. However, embodiments are not limited thereto, and the light-emitting device 100 according to an example embodiment may be transferred by various methods such as a pick-and-place method, etc.

The light-emitting devices 100, 100a, 100b, 100c, 100d, 100e, and 100f described above may be used as emission sources of various devices. For example, the light-emitting devices 100, 100a, 100b, 100c, 100d, 100e, and 100f may be applied to an illumination device or a self-emission display apparatus.

FIGS. 11A to 11E are diagrams illustrating a process of manufacturing a display apparatus 400 by using the light-emitting device 100, according to an example embodiment.

Figure 11A:
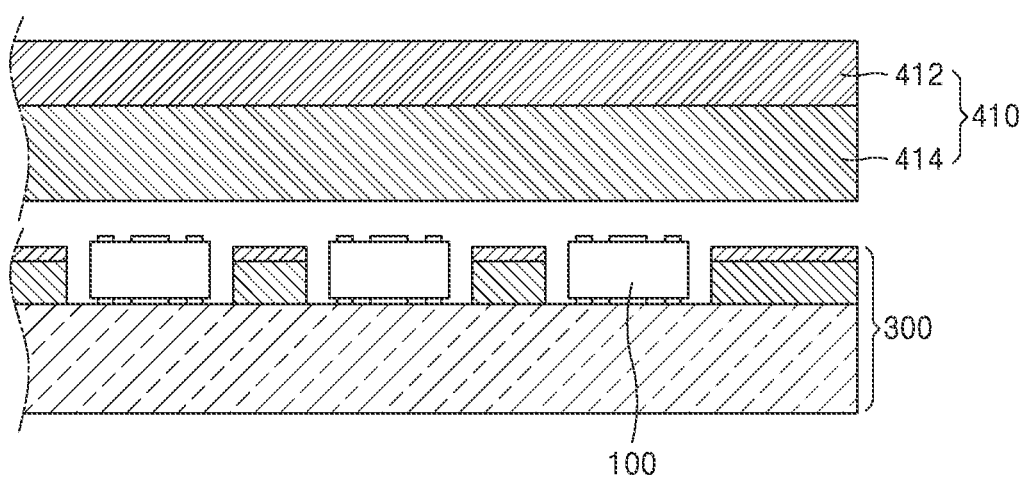
FIGS. 11A, 11B, 11O, 11D, and 11E are diagrams illustrating a process of manufacturing a display apparatus by using a light-emitting device, according to an example embodiment.

Referring to FIG. 11A, a target substrate 410 may be aligned on the transfer substrate 300 to which the light-emitting device 100 is transferred. The light-emitting device 100 may be transferred to the transfer substrate 300 by a fluidic self-assembly method, a pick-and-place method, etc. The target substrate 410 may include a substrate 412 and a driving layer 414. The substrate 412 may include an insulating material such as glass, organic polymer, crystal, etc. Further, the substrate 412 may include a flexible material to bend or fold, and may have a single-layer structure or a multi-layer structure. The driving layer 414 may include a transistor driving the light-emitting device 100, an electrode pattern, etc. The electrodes of the light-emitting device 100 may be arranged to face the electrode pattern formed on the target substrate 410. The electrodes of the light-emitting device 100 facing the electrode pattern may be the first and second electrodes 121 and 122, or may be the third and fourth electrodes 123 and 124.

Figure 11B:
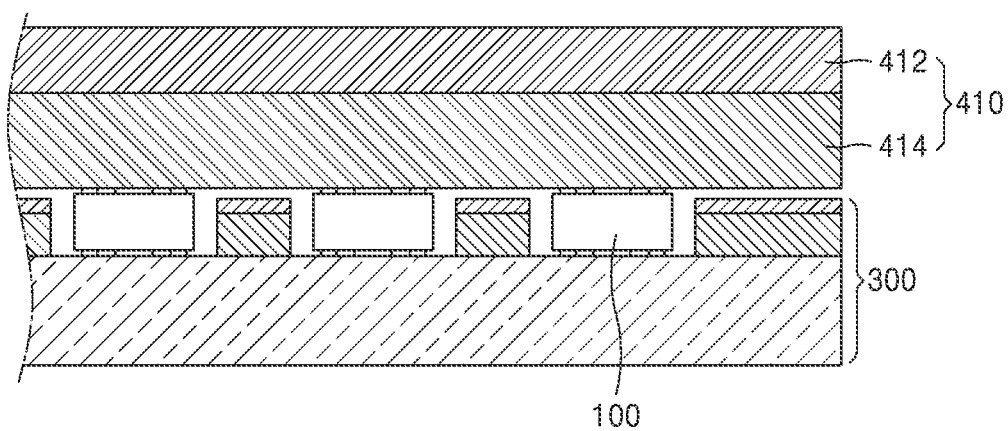

As shown in FIG. 11B, the light-emitting device 100 may be transferred to the target substrate 410. For example, the light-emitting device 100 may be transferred to the target substrate 410 by a bonding method. After aligning the transfer substrate 300 and the target substrate 410, the light-emitting device 100 may be bonded to the target substrate 410 using thermo-compression, ultrasonic, or light (e.g., laser and UV). For example, when thermo-compression is applied between the electrodes of the light-emitting device 100 and the electrode pattern of the target substrate 410, The electrodes of the light-emitting device 100 and the electrode pattern of the target substrate 410 may be compressed in proportion to the pressure and temperature and bonded to the electrodes of the light-emitting device 100 and the electrode pattern of the target substrate 410.

Figure 11C:
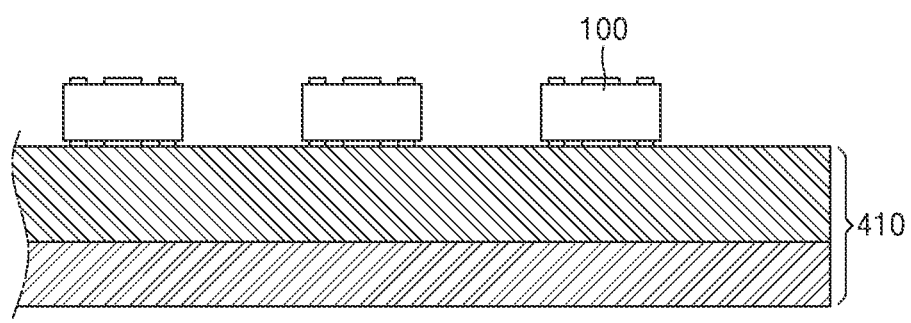

After transferring the light-emitting device 100 to the target substrate 410, the transfer substrate 300 is removed. Then, as shown in FIG. 11C, the position of the target substrate 410 may be changed such that the light-emitting device 100 may be arranged on the top.

When the transfer substrate 300 itself is a target substrate including a driving layer, the light-emitting device 100 may be bonded to the transfer substrate 300 without an additional transfer.

Figure 11D:
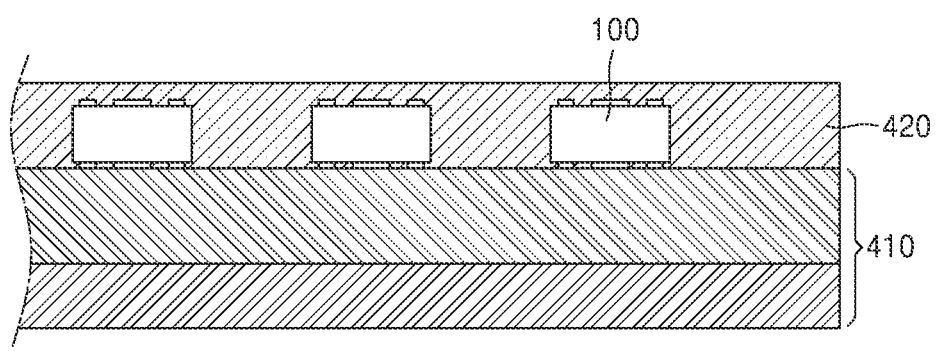

As shown in FIG. 11D, a planarization layer 420 may be formed on the light-emitting device 100 and the target substrate 410. The planarization layer 420 may cover the light-emitting device 100 and have a flat upper surface. The planarization layer 420 may alleviate a step generated by components arranged below the planarization layer 420, and may prevent oxygen and moisture from penetrating into the light-emitting device 100. The planarization layer 420 may be formed of an insulating material. The planarization layer 420 may include an organic insulating film (e.g., acrylic or silicon-based polymer) or an inorganic insulating film (e.g., silicon oxide ($SiO_2$), silicon nitride (SiN), aluminum oxide ($Al_2O_3$), or titanium oxide ($TiO_2$)), but embodiments are not limited thereto. The planarization layer 420 may be formed of a plurality of insulating materials having different dielectric constants in a multi-layered structure.

Figure 11E:
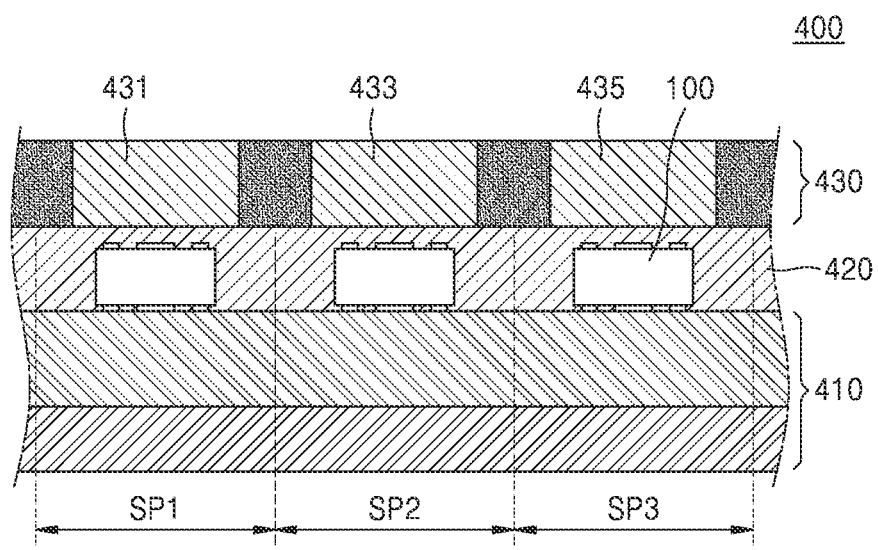

As shown in FIG. 11E, a color conversion layer 430 may be formed on the planarization layer 420. When the light-emitting device 100 emits light of the same wavelength, the color conversion layer 430 may include a first color conversion pattern 431, a second color conversion pattern 433, and a third color conversion pattern 435 that convert the light generated in the light-emitting device 100 into light of a predetermined wavelength. Here, each of the first to third color conversion patterns 431, 433, and 435 may correspond to each sub-pixel. For example, the first color conversion pattern 431 may correspond to a first sub-pixel SP1, and the second color conversion pattern 433 may correspond to a second sub-pixel SP2, and the third color conversion pattern 435 may correspond to a third sub-pixel SP3. The color conversion layer 430 may be formed by a photolithography method.

In FIG. 11E, the light-emitting device 100 emits light of the same wavelength, but embodiments are not limited thereto. When each of the light-emitting devices 100 functions as a sub-pixel by emitting different light, for example, red, blue, and green light, a color conversion layer may not be formed.

In the display apparatus 400 manufactured through the process illustrated in FIG. 11B, lower electrodes of the light-emitting device 100 and the driving layer are electrically connected, but embodiments are not limited thereto. Upper electrodes of the light-emitting device 100 and the driving layer may also be electrically connected.

FIGS. 12A to 12E are diagrams illustrating a process of manufacturing a display apparatus 500 by using the light-emitting device 100, according to another example embodiment.

Figure 12A:
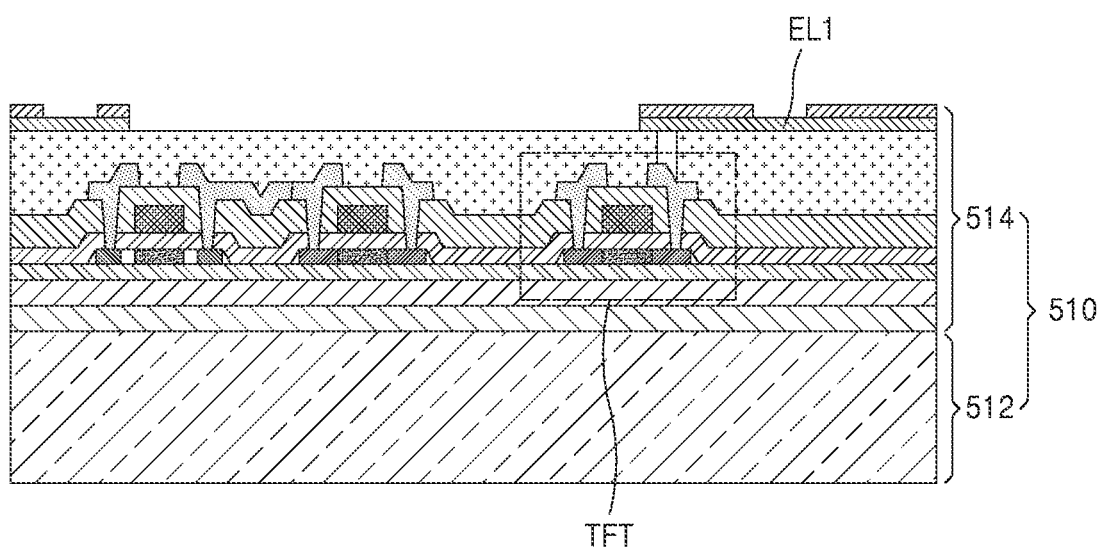
FIGS. 12A, 12B, 12C, 12D, and 12E are diagrams illustrating a process of manufacturing a display apparatus by using a light-emitting device, according to another example embodiment.

As shown in FIG. 12A, a driving layer 514 may be formed on a substrate 512. The driving layer 514 may include a thin-film transistor (TFT), a first electrode pattern EL1, a capacitor, etc.

Figure 12B:
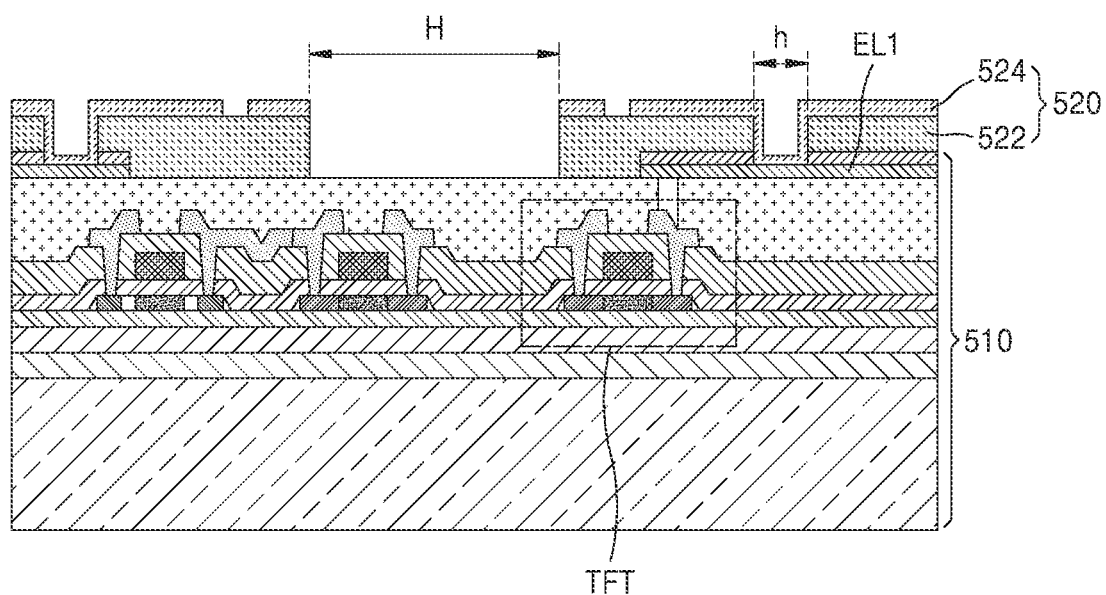

As shown in FIG. 12B, a flexible partition 520 having a groove H may be formed on the driving layer 514. The flexible partition 520 may include a polymer layer 522 and a metal layer 524. The metal layer 524 may be electrically connected to the first electrode pattern EL1 of the driving layer 514 via a hole h formed in the polymer layer 522. The substrate 512, the driving layer 514, and the flexible partition 520 may form a transfer substrate.

Figure 12C:
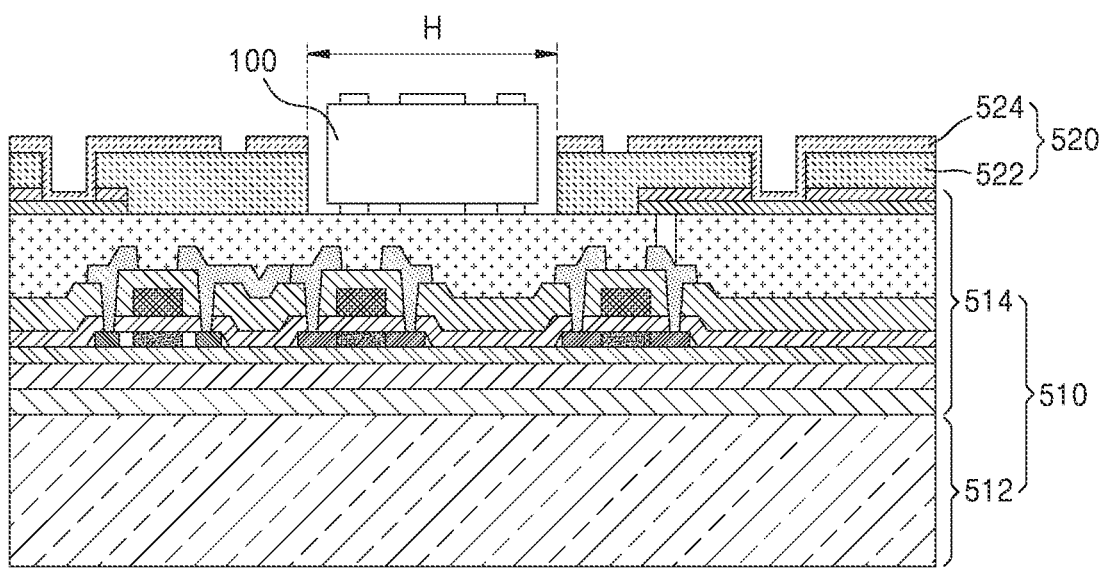

As shown in FIG. 12C, the light-emitting device 100 may be transferred in the groove H. The transfer of the light-emitting device 100 may be the same as shown in FIG. 1A, but embodiments are not limited thereto. The light-emitting devices 100a, 100b, 100c, 100d, 100e, and 100f shown in FIGS. 3 to 8 may also be transferred. The light-emitting device 100 may be transferred by, for example, a fluidic self-assembly method or a pick-and-place method.

Figure 12D:
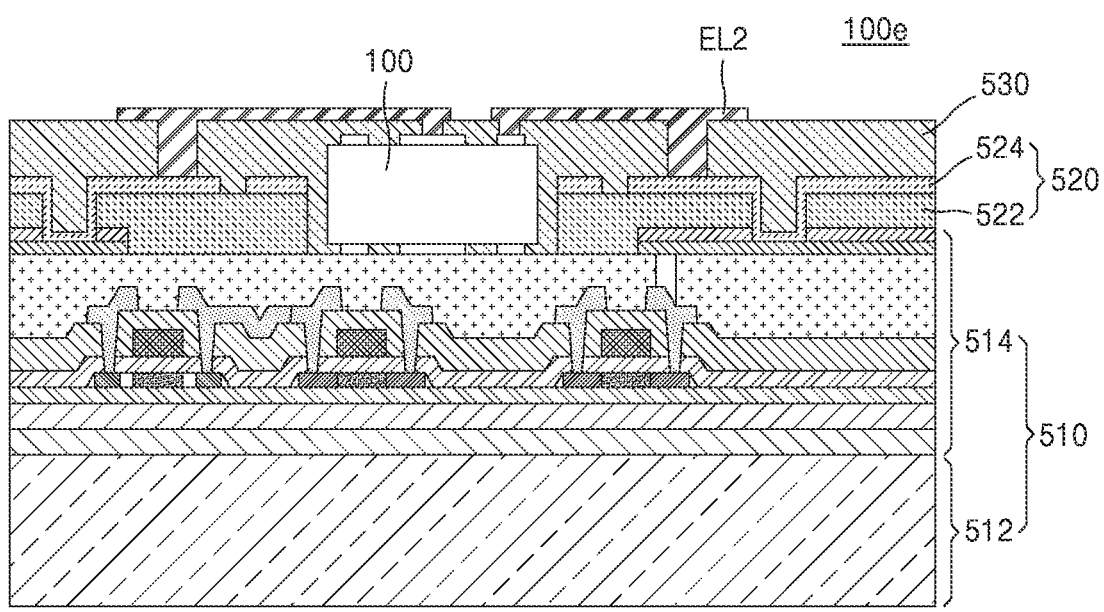

As shown in FIG. 12D, an insulating layer 530 covering the light-emitting device 100 and at least a portion of the flexible partition 520 may be formed, and a second electrode pattern EL2 electrically connecting the upper electrodes of the light-emitting device 100 and the driving layer 514 may be formed. The second electrode pattern EL2 may be electrically connected to the first electrode pattern EL1 of the driving layer 514 via the metal layer 524 of the flexible partition 520. The insulating layer 530 may prevent oxygen and moisture from penetrating into the light-emitting device 100.

Figure 12E:
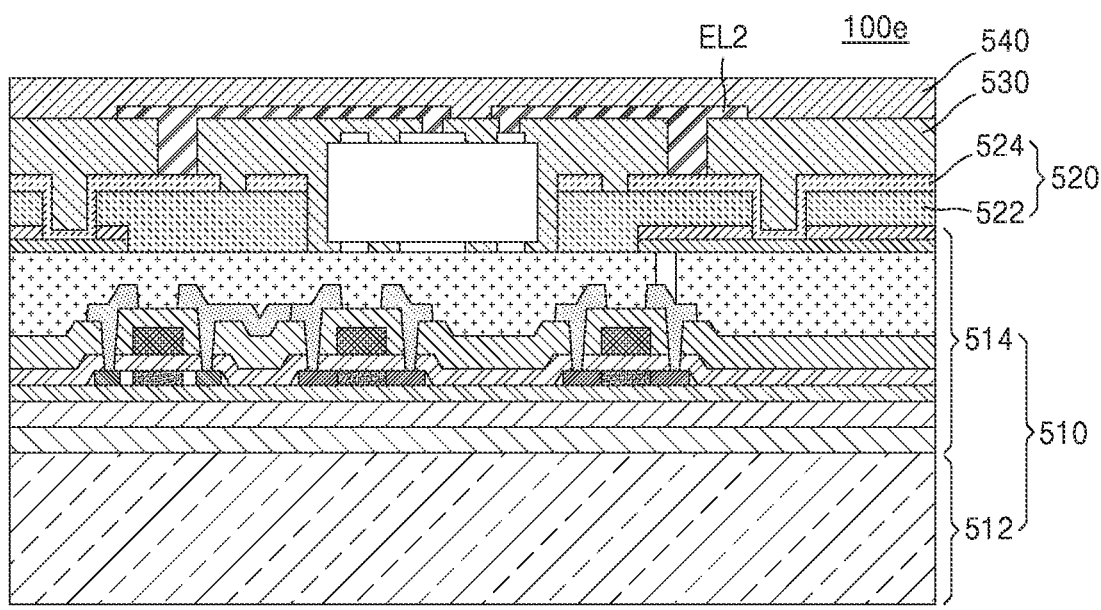

Then, as shown in FIG. 12E, a planarization layer 540 may be formed on the insulating layer 530 and the second electrode pattern EL2. A color conversion layer may be further formed.

Figure 13:
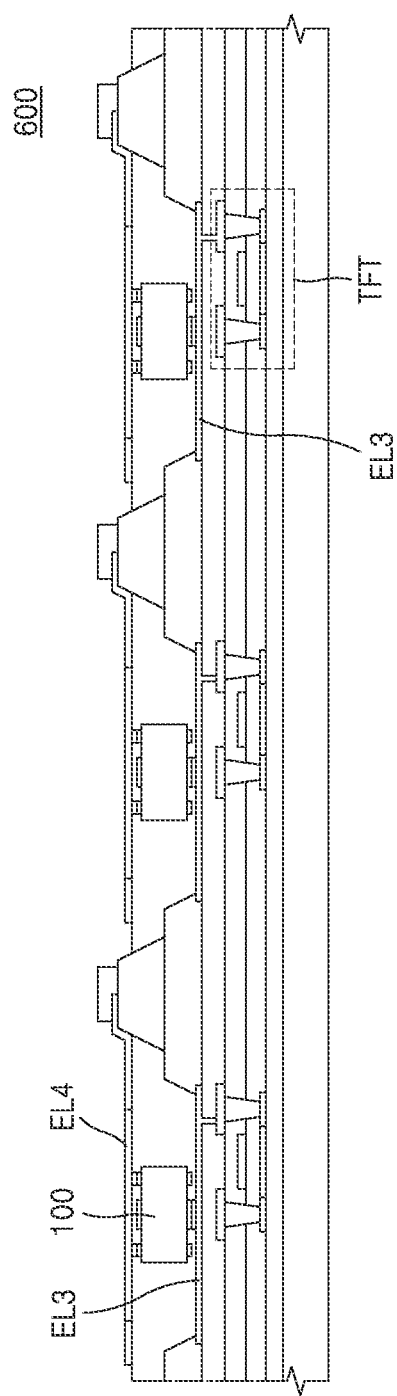
FIG. 13 is a diagram illustrating a display apparatus including a light-emitting device, according to another example embodiment.

FIG. 13 is a diagram illustrating a display apparatus 600 including the light-emitting device 100, according to another example embodiment. The display apparatus 600 of FIG. 13 may include a third electrode pattern EL3 arranged under the light-emitting device 100 and a fourth electrode pattern EL4 arranged on the light-emitting device 100. The third electrode pattern EL3 may be electrically connected to any one of the lower electrodes of the light-emitting device 100, and the fourth electrode pattern EL4 may be electrically connected to any one of the upper electrodes of the light-emitting device 100. For example, the third electrode pattern EL3 may be electrically connected to the third electrode 123 of the light-emitting device 100 without being electrically connected to the fourth electrode 124. The fourth electrode pattern EL4 may be electrically connected to the second electrode 122 without being electrically connected to the first electrode 121.

Because the electrodes are arranged on both surfaces of the light-emitting device 100, a display apparatus may be manufactured by selectively using the lower electrodes and the upper electrodes of the light-emitting device 100, and thus, a method of manufacturing the display apparatus may be diversified.

A display apparatus including the light-emitting devices 100, 100a, 100b, 100c, 100d, 100e, and 100f described above may be employed in various electronic devices. For example, the display apparatus may be applied to a television, a laptop, a mobile phone, a smartphone, a smart pad (PD), a portable media player (PMP), personal digital assistants (PDA), navigation, various wearable devices such as a smart watch and a head mounted display, etc.

It should be understood that example embodiments described herein should be considered in a descriptive sense only and not for purposes of limitation. Descriptions of features or aspects within each example embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims and their equivalents.

What is claimed is:
1. A light-emitting device comprising:
a body comprising a first semiconductor layer, an active layer, and a second semiconductor layer;
a first electrode and a second electrode provided on a first surface of the body, the first electrode and the second electrode being in contact with a first surface of the first semiconductor layer and a first surface of the second semiconductor layer, respectively;

a third electrode and a fourth electrode provided on a second surface of the body, the third electrode and the fourth electrode being in contact with the first surface of the first semiconductor layer and a second surface of the second semiconductor layer opposite to the first surface of the second semiconductor layer, respectively; and a first trench passing through the first semiconductor layer and the active layer and exposing the second semiconductor layer, wherein the second electrode is in contact with the first surface of the first semiconductor layer via the first trench, the fourth electrode is in contact with the second surface of the second semiconductor layer, and the second electrode and the fourth electrode are not connected to each other.

2. The light-emitting device of claim 1, further comprising a through hole passing through the body, wherein the first electrode is in contact with the third electrode via the through hole.

3. The light-emitting device of claim 2, further comprising a first insulating layer provided on an inner wall of the through hole.

4. The light-emitting device of claim 3, wherein the first insulating layer extends to the second surface of the body and is in contact with the fourth electrode.

5. The light-emitting device of claim 2, wherein the first electrode is provided inside of the through hole.

6. The light-emitting device of claim 1, wherein the first electrode overlaps with at least a portion of the third electrode in a thickness direction of the body.

7. The light-emitting device of claim 1, wherein the second electrode overlaps with at least a portion of the fourth electrode in a thickness direction of the body.

8. The light-emitting device of claim 1, wherein the second electrode is in contact with the second semiconductor layer via the first trench.

9. The light-emitting device of claim 8, further comprising a second insulating layer provided on an inner wall of the first trench.

10. The light-emitting device of claim 9, wherein the second insulating layer extends to the first surface of the body and is in contact with the first electrode.

11. The light-emitting device of claim 9, wherein the second electrode is provided inside of the first trench.

12. The light-emitting device of claim 1, wherein at least one of the first electrode, the second electrode, the third electrode, and the fourth electrode is symmetrical with respect to a central axis of the light-emitting device.

13. The light-emitting device of claim 1, wherein at least one of the first electrode, the second electrode, the third electrode, and the fourth electrode has a circular cross-sectional shape.

14. The light-emitting device of claim 1, wherein at least one of the first electrode, the second electrode, the third electrode, and the fourth electrode has a ring cross-sectional shape.

15. The light-emitting device of claim 1, wherein at least one of the first electrode, the second electrode, the third electrode, and the fourth electrode is transparent.

16. The light-emitting device of claim 1, further comprising a second trench provided between the first electrode and the second electrode in the first surface of the body.

17. The light-emitting device of claim 1, wherein a width of the body in a horizontal direction is greater than a thickness of the body in a vertical direction.

* * * * *